(12) United States Patent
Cheng et al.

(10) Patent No.: US 10,446,361 B2
(45) Date of Patent: Oct. 15, 2019

(54) ABERRATION CORRECTION METHOD, ABERRATION CORRECTION SYSTEM, AND CHARGED PARTICLE BEAM APPARATUS

(71) Applicant: HITACHI HIGH-TECHNOLOGIES CORPORATION, Minato-ku, Tokyo (JP)

(72) Inventors: Zhaohui Cheng, Tokyo (JP); Tomonori Nakano, Tokyo (JP); Kotoko Urano, Tokyo (JP); Takeyoshi Ohashi, Tokyo (JP); Yasunari Sohda, Tokyo (JP); Hideyuki Kazumi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/741,038

(22) PCT Filed: Jul. 1, 2015

(86) PCT No.: PCT/JP2015/069048
§ 371 (c)(1),
(2) Date: Dec. 29, 2017

(87) PCT Pub. No.: WO2017/002243
PCT Pub. Date: Jan. 5, 2017

(65) Prior Publication Data
US 2018/0190469 A1    Jul. 5, 2018

(51) Int. Cl.
*H01J 37/153* (2006.01)
*H01J 37/141* (2006.01)
(Continued)

(52) U.S. Cl.
CPC .......... *H01J 37/153* (2013.01); *H01J 37/141* (2013.01); *H01J 37/1474* (2013.01);
(Continued)

(58) Field of Classification Search
CPC .......... H01J 37/00; H01J 37/02; H01J 37/023; H01J 37/07; H01J 37/10; H01J 37/12;
(Continued)

(56) References Cited

U.S. PATENT DOCUMENTS

| | | | |
|---|---|---|---|
| 2006/0169895 A1* | 8/2006 | Honda | H01J 37/153 250/310 |
| 2014/0217304 A1 | 8/2014 | Nakano et al. | |
| 2016/0233049 A1 | 8/2016 | Sasaki et al. | |

FOREIGN PATENT DOCUMENTS

| | | |
|---|---|---|
| JP | 54-068150 A | 6/1979 |
| JP | 2006-140119 A | 6/2006 |

(Continued)

OTHER PUBLICATIONS

Joachim Zach et al.; Aberration Correction in a Low Voltage SEM by a Multiple Corrector; Nuclear Instruments and Methods in Physics Research; A363; 1995; pp. 316-325.

*Primary Examiner* — Jason L McCormack
(74) *Attorney, Agent, or Firm* — Miles & Stockbridge P.C.

(57) ABSTRACT

In order to provide an aberration correction system that realizes a charged particle beam of which the anisotropy is reduced or eliminated on a sample surface even in the case where there is magnetic interference between pole stages of an aberration corrector, an correction system includes a line cross position control device (209) which controls a line cross position in the aberration corrector of the charged particle beam so that a designed value and an actually measured value of the line cross position are equal to each other, an image shift amount extraction device (210), and a feedback determination device (211) which determines whether or not changing an excitation amount of the aber- (Continued)

ration corrector is necessary whether or not changing an excitation amount is necessary from an extracted image shift amount.

15 Claims, 12 Drawing Sheets

(51) Int. Cl.
    *H01J 37/147* (2006.01)
    *H01J 37/22* (2006.01)
    *H01J 37/244* (2006.01)
    *H01J 37/28* (2006.01)

(52) U.S. Cl.
    CPC .......... *H01J 37/222* (2013.01); *H01J 37/244* (2013.01); *H01J 37/28* (2013.01); *H01J 2237/1405* (2013.01); *H01J 2237/1534* (2013.01); *H01J 2237/1536* (2013.01); *H01J 2237/221* (2013.01); *H01J 2237/2806* (2013.01); *H01J 2237/2809* (2013.01)

(58) Field of Classification Search
    CPC ...... H01J 37/14; H01J 37/141; H01J 37/1413; H01J 37/143; H01J 37/145; H01J 37/147; H01J 37/153; H01J 37/15; H01J 37/26; H01J 37/261
    USPC ........................................ 250/306, 307, 311
    See application file for complete search history.

(56) References Cited

FOREIGN PATENT DOCUMENTS

| | | |
|---|---|---|
| JP | 2013-58382 A | 3/2013 |
| WO | WO 2015/045468 A1 | 4/2015 |

\* cited by examiner

TOP VIEW

CROSS-SECTIONAL VIEW

CROSS-SECTIONAL VIEW

ABERRATION CORRECTION METHOD, ABERRATION CORRECTION SYSTEM, AND CHARGED PARTICLE BEAM APPARATUS

TECHNICAL FIELD

The present invention relates to an aberration correction method, an aberration correction system, and a charged particle beam apparatus.

BACKGROUND ART

In a charged particle beam apparatus typified by a scanning electron microscope (hereinafter, referred to as an SEM) and a scanning transmission electron microscope (hereinafter, referred to as an STEM), an aberration corrector has been incorporated in order to improve the resolution. The aberration corrector is configured with plural stages of multipole lenses and generates an electric field or a magnetic field to eliminate aberration contained in a charged particle beam passing through the interior thereof by using the multipole lenses. NPL 1 discloses an aberration corrector using four stages of multipole lenses.

In addition, generally, in order to correct aberrations in an arbitrary direction, a line cross (a function of only a convex lens in a specific direction and a function of a concave lens in a direction perpendicular to the specific direction) is formed in directions where the incident charged particle beams are perpendicular at different positions in the traveling direction, negative aberration is generated independently of each perpendicular direction and is applied to the charged particle beam passing through an aberration corrector. Hereinafter, the direction of the convex lens is referred to as a line cross direction, and the direction of the concave lens is referred to as a line cross parallel direction.

Furthermore, since it is required that there is no anisotropy in the aperture angle and the optical magnification of the electron beam on the sample surface after the aberration correction for the convenience of application, in general, the corrector is designed so that the above condition is satisfied when the line cross is formed at the center of the traveling direction (hereinafter, referred to as a z direction) of the charged particle beams of the second-stage and third-stage multipoles. In addition, in the aberration correction, as disclosed in PTL 1, the trajectory of the charged particle beam is constructed so that a line cross is formed in the perpendicular directions at the center position of the z-direction the second-stage and third-stage multipoles. More specifically, by using a deflector configured with second-stage and third-stage multipoles for the corrector, the intensities of the quadrupole fields of the first stage and the second stage are adjusted so that all the deflection sensitivities in the line cross direction becomes sufficiently small, and thus, the line cross position is aligned the with the center position in the z direction of the poles of the second stage and third stage, so that the trajectory for aberration correction is constructed.

CITATION LIST

Patent Literature

PTL 1: Japanese Patent Application Publication No. 2006-140119

Non-Patent Literature

NPL 1: Nuclear Instruments and Methods in Physics Research, A363 (1995), Pages 316 to 325

SUMMARY OF INVENTION

Technical Problem

In the construction of the trajectory for aberration correction, in PTL 1, since the line cross in the perpendicular directions is formed at the center position in the direction of the optical axis (z) of the multipoles of the second stage and the third stage, a method of adjusting the intensities of the quadrupole fields of the first stage and the second stage is employed so that the shift amount of the SEM image becomes equal to or smaller than a predetermined threshold value even through the intensities of the dipole fields in the line cross direction are changed.

Therefore, the inventors applied the above-described method to an aberration corrector which is miniaturized. However, it is found that, the electric field and the magnetic field are superposed in the poles of the second stage and the third stage (stage forming the line cross) of the aberration corrector, and generally, due to the magnetic interference between the stages of the poles configured with a magnetic material, the center in the z direction of multipole deflection fields, the center in the z direction of the quadrupole fields, and the center in the z direction of the poles do not coincide with each other. This phenomenon tends to be remarkably exhibited as the distance between the multipoles is shortened along with the miniaturization of the aberration corrector. FIG. 1 is a diagram illustrating a profile of a magnetic flux density on an optical axis in the case where an electromagnetic dipole field is applied to a second-stage multipole 102 of an aberration corrector configured with a four-stage multipole made of a magnetic material. The center position (measured position) in the optical axis direction of the dipole field due to the interference between the stages of the magnetic poles is deviated from the center position (designed position) in the optical axis direction of the poles and the center position in the optical axis direction of the quadrupole field of the second stage. In the related art, since the line cross position of the charged particle beam determined by the dipole field wobbling is naturally deviated from the center position of the multipoles in the optical axis direction, uniformity of the aperture angle of the charged particle beam and the optical magnification on the sample surface cannot be realized. As a result, anisotropy occurs in the resolution and depth of focus of the charged particle beam on the sample surface, which is a hindrance to highly accurate inspection and measurement, especially when observing fine patterns.

An object of the present invention is to provide an aberration correction method, an aberration correction system, and a charged particle beam apparatus for realizing a charged particle beam of which anisotropy is reduced or eliminated on a sample surface even in the case where there is magnetic interference between pole stages of an aberration corrector.

Solution to Problem

According to one embodiment for achieving the above object, there is provided a charged particle beam apparatus including: a charged particle source; a deflector which deflects a charged particle beam configured with charged particles emitted from the charged particle source; an objective lens which concentrates the charged particle beam and irradiates a sample; a detector which detects secondary electrons emitted from the sample by irradiation of the charged particle beam; an image calculation unit which generates an image based on the secondary electrons detected by the detector; an aberration corrector which is arranged at a subsequent stage of the deflector and corrects aberration of the charged particle beam; a correction system which controls the aberration corrector; and a control unit which controls the components, wherein the aberration corrector includes two or more stages of multipoles which control the aberration of the charged particle beam, wherein the multipoles of the first stage and the second stage constitute a first deflection unit and a second deflection unit which cause a deflection action in at least two directions of x and y directions, wherein the correction system includes: a line cross position control device which controls a line cross position in the aberration corrector of the charged particle beam so that a designed value and an actually measured value of a line cross direction are equal to each other; an optical axis control device which controls an optical axis of the charged particle beam; an image shift amount extraction device which extracts an image shift amount from an acquired image; a feedback determination device which determines whether or not changing an excitation amount of at least one quadrupole field configured with multipoles from the extracted image shift amount; and a feedback amount calculation device which calculates a feedback amount with respect to the excitation amount of the quadrupole field based on a table data for calculating a feedback amount generated in advance in the case where the determination by the feedback determination device is necessary.

In addition, there is provided a correction system controlling an aberration corrector where two or more stages of multipoles which are arranged at a subsequent stage of a deflector deflecting a charged particle beam configured with charged particles emitted from a charged particle source and control aberration of the charged particle beam are provided and the multipoles of a first stage and a second stage constitute a first deflection unit and a second deflection unit which cause a deflection action in at least two directions of x and y directions, the correction system including: a line cross position control device which controls a line cross position in the aberration corrector of the charged particle beam so that a designed value and an actually measured value of a line cross direction are equal to each other; an optical axis control device which controls an optical axis of the charged particle beam; an image shift amount extraction device which extracts an image shift amount from an acquired image; a feedback determination device which determines whether or not changing an excitation amount of at least one quadrupole field configured with multipoles from the extracted image shift amount; and a feedback amount calculation device which calculates a feedback amount with respect to the excitation amount of the quadrupole field based on a table data for calculating a feedback amount generated in advance in the case where the determination by the feedback determination device is necessary.

In addition, there is provided an aberration correction method for controlling an aberration corrector where three or more stages of multipoles which are arranged at a subsequent stage of a deflector deflecting a charged particle beam configured with charged particles emitted from a charged particle source and control aberration of the charged particle beam are provided and the multipoles of a second stage and a third stage constitute a first deflection unit and a second deflection unit which cause a deflection action in at least two directions of x and y directions, the aberration correction method including:

a first step of applying a voltage or excitation current to quadrupole fields of a first stage and the second stage to form line cross in the x direction and the y direction which have different directions in the vicinity of the poles of the second stage and the third stage;

a second step of performing focusing and optical axis adjustment of the charged particle beam on a surface of a sample arranged at a subsequent stage of the aberration corrector;

a third step of acquiring an SEM image under a condition that dipole fields of the second stage, the third stage, and the deflector in the x direction and/or the y direction are all off and single on;

a fourth step of calculating at least two of the following items by using the SEM image, (1) (deflection amount or deflection sensitivity of the first polarization unit of the aberration corrector in the x direction)−(deflection amount or deflection sensitivity of the second deflection unit in the y direction), (2) (deflection amount or deflection sensitivity of the first polarization unit of the aberration corrector in the y direction)−(deflection amount or deflection sensitivity of the second deflection unit in the x direction), (3) (deflection amount or deflection sensitivity of the deflector in the x direction)−(deflection amount or deflection sensitivity of the deflector in the y direction), (4) (value of deflection amount or deflection sensitivity of the first deflection unit of the aberration corrector in the x direction)−(predetermined value (depending on optical conditions)), (5) (value of deflection amount or deflection sensitivity of the second deflection unit of the aberration corrector in the y direction)−(predetermined value (depending on the optical conditions)), (6) (value of deflection amount or deflection sensitivity of the first deflection unit of the aberration corrector in the y direction)−(predetermined value (depending on the optical conditions)), (7) (value of deflection amount or deflection sensitivity of the second deflection unit of the aberration corrector in the x direction)−(predetermined value (depending on the optical conditions)), (8) (value of deflection amount or deflection sensitivity of the deflector in the x direction)−(predetermined value (depending on optical conditions)), and (9) (value of deflection amount or deflection sensitivity of the deflector in the y direction)−(predetermined value (depending on optical conditions));

a fifth step of comparing the values of at least two items obtained in the fourth step with respective predetermined threshold values; and a sixth step of performing the feedback to the applied voltage or the excitation current of the quadrupole fields of the first stage and the second stage in the case where the values of the at least two items are larger than the respective predetermined threshold values in the fifth step and terminating the feedback in the other cases.

Advantageous Effects of Invention

According to the present invention, even in the case where there is magnetic interference between pole stages of an aberration corrector, it is possible to provide an aberration correction method, an aberration correction system, and a charged particle beam apparatus for realizing a charged particle beam of which anisotropy is reduced or eliminated on a sample surface.

BRIEF DESCRIPTION OF DRAWINGS

FIG. 5A illustrates the correction system (alignment device), and FIG. 5B illustrates a control flowchart in an aberration correction method.

DESCRIPTION OF EMBODIMENTS

Figure 1:
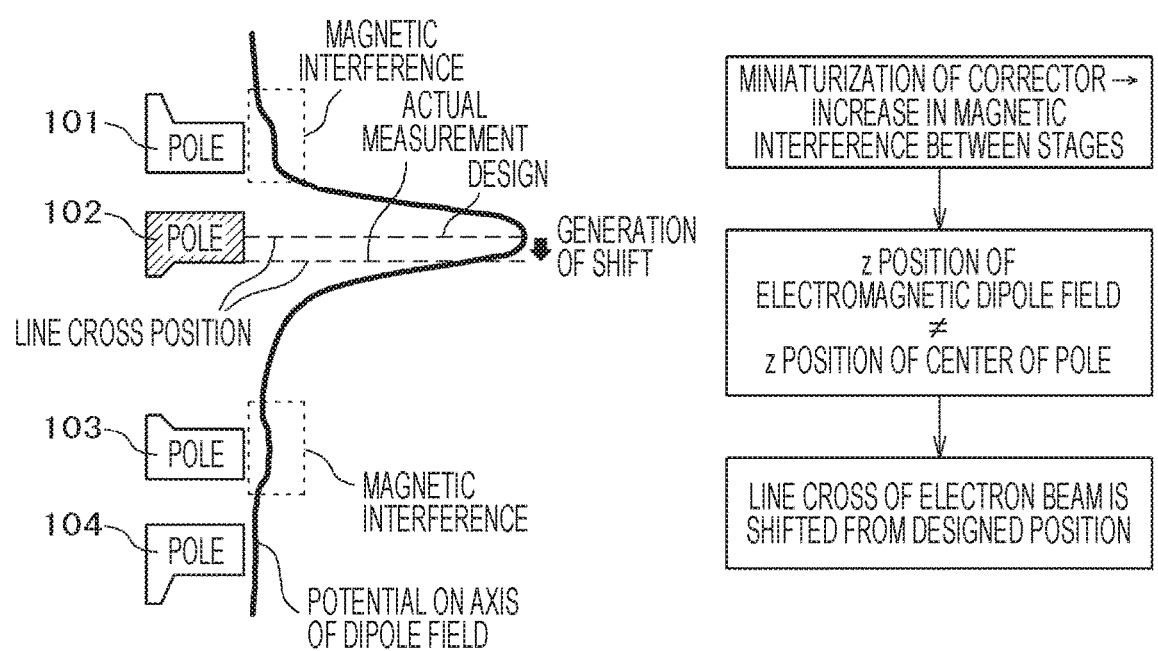
FIG. 1 is a diagram illustrating a problem of the present invention and illustrating a profile of a magnetic flux density on an optical axis in the case where an electromagnetic dipole field is applied to a second stage of an aberration corrector configured with a four-stage multipole made of a magnetic material.

In order to solve the above-described problems, description will be made with respect to results and examination contents which the inventors examined.

By changing intensities of first-stage and second-stage quadrupole fields (line cross formation) of the aberration corrector, a line cross position of the X and Y trajectories of the charged particle beam is changed, and in respective setting conditions, the intensities of the first-stage and second-stage quadrupole fields in which values of at least two items among (1) to (9) are smaller than predetermined threshold values are searched and determined.

(1) a difference between a deflection amount or deflection sensitivity X2 of a charged particle beam in a line cross direction (direction in which focusing is performed in the second stage (convex lens direction). Hereinafter, the direction is abbreviated as an x direction. In this case, the charged particle beam extends linearly in the y direction (concave lens direction)) when using a deflector configured with second-stage multipoles and a deflection amount or deflection sensitivity Y3 of the charged particle beam a line cross direction (direction in which focusing is performed in the third stage (convex lens direction). Hereinafter, the direction is abbreviated as a y direction. A line cross parallel direction in the second-stage. In this case, the charged particle beam extends linearly in the x direction (concave lens direction)) when using a deflector configured with third-stage multipoles, (2) a difference between a deflection amount or deflection sensitivity Y2 of a charged particle beam in a line cross parallel direction (y direction) when using a deflector configured with second-stage multipoles and a deflection amount or deflection sensitivity X3 of a charged particle beam in a line cross parallel direction (x direction) when using a deflector configured with third-stage multipoles, (3) a difference in deflection amount or deflection sensitivity in at least two different directions caused by a deflector that deflects the charged particle beam closer to the charged particle source than to the aberration corrector and adjusts an incident position with respect to the aberration corrector (for example, X0–Y0), (4) a difference between the X2 and a predetermined value (depending on the optical condition)

(5) a difference between the Y3 and a predetermined value (depending on the optical condition), (6) a difference between the Y2 and a predetermined value (depending on the optical condition), (7) a difference between the X3 and a predetermined value (depending on the optical condition), (8) a difference between the X0 and a predetermined value (depending on the optical condition), and (9) a difference between the Y0 and a predetermined value (depending on optical conditions).

By using this method, it is possible to construct a trajectory of a charged particle beam necessary for aberration correction and construct a charged particle probe having no anisotropy in the aperture angle and the optical magnification of the charged particle beam on the sample surface. The reason will be explained below.

Figure 2A:
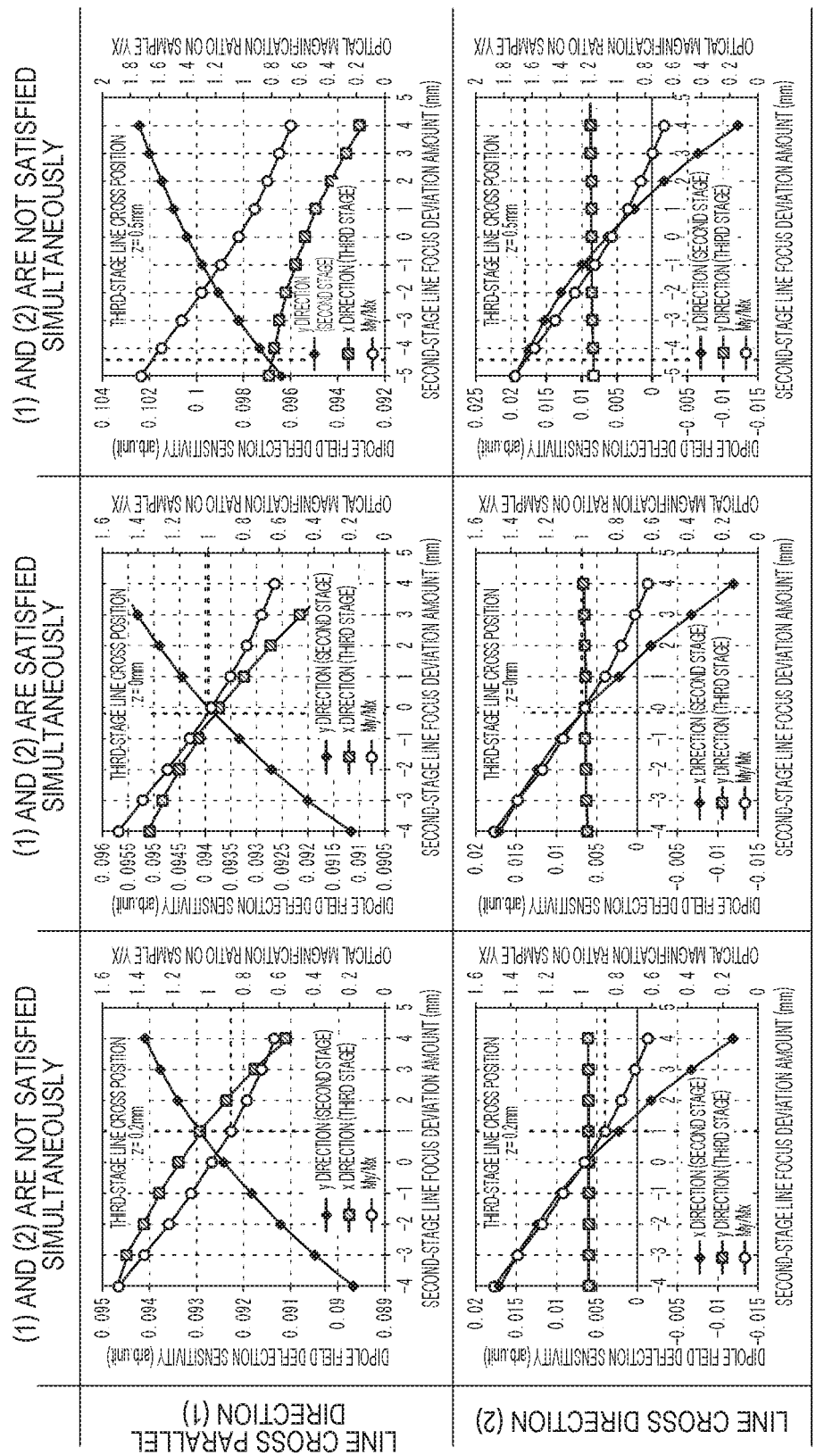
FIG. 2A is a diagram illustrating changes in deflection sensitivities of second-stage and third-stage multipole deflectors and optical magnification ratios in the x and y directions on a sample surface according to a line cross position within an aberration corrector for a charged particle beam, the upper row illustrates a line cross parallel direction, the lower row illustrates a line cross direction, the left side illustrates the case of a line cross position z=0.2 mm, the center illustrates the case of the line cross position z=0 mm, and the right side illustrates the case of the line cross position z=−0.5 mm.

FIG. 2A illustrates, in the case where the line cross position (z direction) of the third stage of the aberration corrector is fixed to three values, and when the line cross position (z direction) of the second stage is changed, changes in the deflection sensitivities (line cross direction and line cross parallel direction) of the dipole field of the second or third stage and optical magnification ratios in the x and y directions of the charged particle beam on the sample. It can be understood that, in the case where magnetic interference exists between the poles, the line cross position (z direction) where both the deflection sensitivities X2 and Y3 in the line cross direction become 0 does not exist at the center position in the z direction of the pole.

For example, although the second-stage line focus deviation amount at X2–Y3=0 in the line cross direction illustrated in the left upper and lower diagrams (third-stage line cross position z=0.2 mm) in FIG. 2A is 0, but the line focus deviation amount in the second stage at Y2–X3=0 in the line cross parallel direction is 1 mm. In this case, the ratio (My/Mx) of the optical magnification in the x and y directions is about 0.95 in the line cross direction and about 0.88 in the line cross parallel direction. This denotes that the cross-sectional shape of the charged particle beam is initially round, but the cross-sectional shape thereof is not rounded (there is no anisotropy).

In addition, the second-stage line focus deviation amount at X2–Y3=0 in the line cross direction illustrated on the right upper and lower diagrams (third-stage line cross position z=−0.5 mm) in FIG. 2A is −0.5 mm, and the second-stage line focus deviation amount at Y2–X3=0 in the line cross direction is −4.5 mm. In this case, the ratio (My/Mx) of the optical magnification in the x and y directions is about 1.1 in the line cross direction and about 1.66 in the line cross parallel direction, and the magnification ratios are different. This denotes that the cross-sectional shape of the charged particle beam is initially round, but the cross-sectional shape thereof not rounded (there is no anisotropy).

On the other hand, as illustrated in the central upper and lower diagrams of FIG. 2A, the third-stage line cross position z=0 mm, that is, as designed, only in the case where the second-stage and third-stage line cross positions of the aberration corrector are at the center positions of the second-stage and third-stage poles in the z direction, the deflection sensitivities of dipole fields in the second-stage and third-stage line cross directions and line cross parallel directions are allowed to be equal to each other, and the optical magnification ratios of the charged particle beam in the x and y directions on the sample surface become 1. This denotes that the cross-sectional shape of the charged particle beam is initially round, and the cross-sectional shape thereof is still rounded (there is no anisotropy). In other words, by adjusting the first-stage and second-stage quadrupole fields so that the deflection sensitivities of the dipole fields in the second-stage and third-stage line cross directions and line cross parallel directions dipole field with each other, the position of the line cross can be aligned with the center position of the second-stage and third-stage poles, and thus, it is possible to construct a charged particle beam having no anisotropy on the sample surface. FIG. 2A illustrates an example in which the designed value and the actually measured value of the line cross position can be allowed to be equal to each other by adjustment of the two items (1) and (2) among the above-described nine items and illustrates that there is only one matching solution.

Figure 2B:
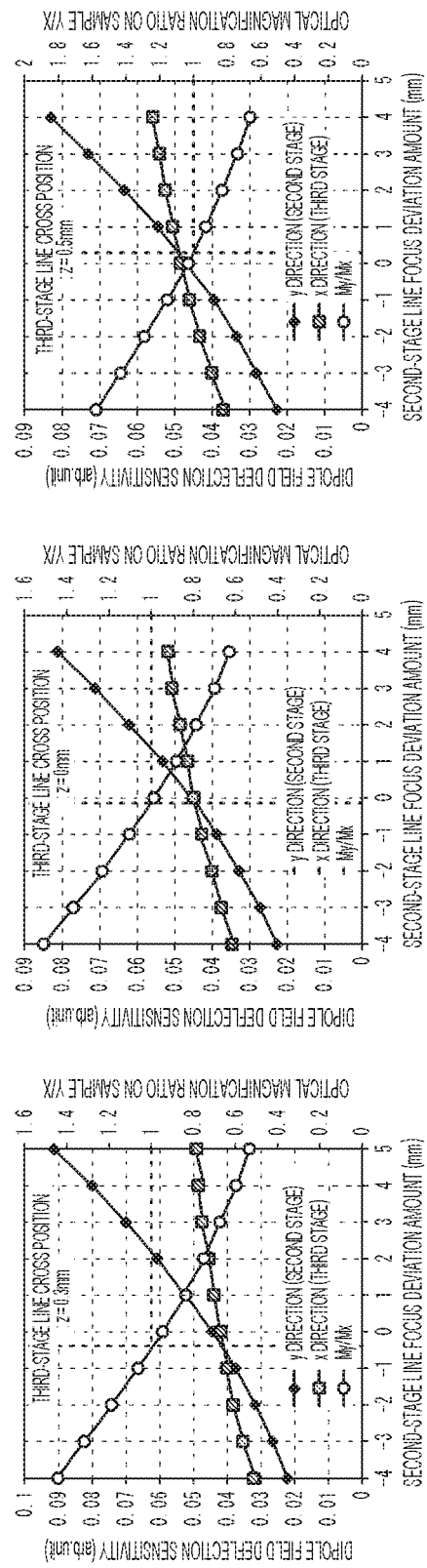
FIG. 2B is a diagram illustrating changes in deflection sensitivities of a deflector between an aberration corrector and a charged particle source according to a line cross position in an aberration corrector for a charged particle beam and optical magnification ratios in the x and y directions on the sample surface, the left side illustrates the case of the line cross position z=0.3 mm, the center illustrates the case of the line cross position z=0 mm, and the right side illustrates the case of the line cross position z=−0.5 mm.

FIG. 2B illustrates a change in the deflection sensitivity in the perpendicular directions according to the line cross position of the charged particle beam in the case where a deflector (dipole field) that deflects the charged particle beam closer to the charged particle source than to the aberration corrector and adjusts an incident position with respect to the aberration corrector is used.

For example, the second-stage line focus deviation amount at Y2–X3=0 in the line cross parallel direction illustrated in the left diagram of FIG. 2B (the third-stage line cross position z=0.3 mm) is −0.5 mm, and the designed value and the actually measured value of the line cross position are different from each other. However, in this case, the ratio (My/Mx) of the optical magnification in the x and y directions is about 1.

The second-stage line focus deviation amount at Y2–X3=0 in the line cross parallel direction illustrated in the right diagram of FIG. 2B (the third-stage line cross position z=−0.5 mm) is about 0.3 mm, and the designed value and the actually measured value of the line cross position are different from each other. In addition, the ratio (My/Mx) of the optical magnification in the x and y directions is about 1.1, and the magnification ratios are different. This denotes that the cross-sectional shape of the charged particle beam is initially round, but the cross-sectional shape thereof is not rounded (there is no anisotropy).

The second-stage line focus deviation amount at Y2–X3=0 in the line cross parallel direction illustrated in the middle diagram (third-stage line cross position z=0 mm) in FIG. 2B is 0 mm. In addition, the ratio (My/Mx) of the optical magnification in the x and y directions is about 1.

In FIG. 2B, there are a plurality of line cross positions where the deflection sensitivities in the perpendicular directions are equal to each other and the optical magnification ratios in the x and y directions on the sample surface are 1 (the left diagram and the middle diagram). Therefore, in FIG. 2B, it cannot be determined that the designed value and the actually measured value of the line cross position are equal to each other only by setting the optical magnification ratios in the x and y directions on the surface of the sample to 1. However, in the left and middle diagrams of FIG. 2B, the values of the change sensitivities of the dipole field are different. In addition, as illustrated in FIG. 2A, it can be understood that the optimum value of the deflection sensitivity of the deflector exists while the line cross is at the center position in the z direction of the second-stage and third-stage poles of the aberration corrector. Not limited to the change sensitivity of the dipole field, the actually measured value of the line cross position can be adjusted to the designed value by combining with the condition of any one of the above-described nine items (however, excluding (2) in this case). If the same amount of aberration occurs in the x and y directions on the sample, the amounts of aberration in the x and y directions generated by the aberration corrector for canceling the aberration become the same, which is desirable from the viewpoint of design and control.

By using the method illustrated in FIG. 2A, for example, the actually measured value and the designed value of the line cross position are allowed to be equal to each other, so that a predetermined value (for example, 0.045) of the above (6) or (7) can be obtained in advance. In addition, not limited to (6) and (7), other predetermined values can be obtained in advance. As a result, after allowing the designed value and the actually measured value of the line cross position to be equal to each other by using (1) and (2), the line cross position can be simply adjusted, for example, periodically by using other items.

At least one or more of the intensities of the first-stage and second-stage quadrupole fields are adjusted based on the results illustrated in FIGS. 2A and 2B so that at least two items among the items (1) to (9) are simultaneously satisfied, and thus, it is possible to realize the charged particle beam of which anisotropy is reduced or eliminated on the sample surface. In addition, similar correction sensitivities can be provided to the x and y directions of the aberration corrector.

According to the present invention, it is possible to construct a trajectory that is required for aberration correction while maintaining that there is no anisotropy in the incident aperture angle and the optical magnification of the charged particle beam 2 on the sample without being affected by the deviation of the center position of the dipole, quadrupole, and multipole in the direction of the optical axis caused by the interference between the stages of the multipoles. In addition, if the focus deviation amount is within the range of ±5%, it can be considered that there is no anisotropy (it can be considered that the designed value and the actually measured value of the line cross position are equal to each other). In addition, since the influence of the magnetic interference between the multipoles is not limited to the magnetic field-based type aberration corrector, and an electrostatic field-based type aberration corrector (in this case, configured with only second-stage and third-stage multipoles among the four stages of the multipoles illustrated in FIG. 4), the method illustrated in this embodiment is also effective for an electrostatic field-based type aberration corrector.

In the following embodiments, an example of a chromatic/spherical aberration corrector with four stages of twelve poles will be described with reference to a plurality of diagrams. In addition, the present invention will be described by using an example using an SEM equipped with an aberration corrector using a multipole. For the simplicity, some components have been omitted from the illustration. In addition, the same components illustrated in the drawings are denoted by the same reference numerals. In addition, the apparatus to be used can be generally applied to charged particle beam apparatuses including SEMs, STEMs, and TEMs equipped with an aberration corrector configured with multistage multipole lenses. For the convenience, the x direction and the y direction of this embodiment are referred to in order to indicate specific directions.

First Embodiment

A charged particle beam apparatus (scanning electron microscope equipped with a chromatic/spherical aberration corrector) according to a first embodiment of the present invention will be described with reference to a schematic overall configuration diagram illustrated in FIG. 3. A charged particle beam 202 emitted from a charged particle source 201 is subjected to a focusing action of a first condenser lens 320, an incidence direction thereof is controlled by a two-stage deflector 323, and the charged particle beam is incident on an aberration corrector 120 which performs various corrections to the charged particle beam 202. After completion of the correction, the charged particle beam 202 is focused by an adjustment lens 324, and a cross is formed between the adjustment lens 324 and an objective lens 331. The position of the cross on an optical axis 129 is controlled by a deflection intensity of the adjustment lens 324. After that, the charged particle beam 202 is focused on a sample 332 mounted on a sample stage 333 by the objective lens 331. The charged particle beam 202 is scanned on a surface of the sample 332, secondary electrons emitted from the sample 332 are detected by a detector 326. An image is displayed on an image display device 338 in synchronization with the scanning position of the charged particle beam by an image calculation unit 337 or stored in a control computer 130. In addition, a bias potential is applied to the sample stage 333 as necessary, and landing energy of the charged particle beam 202 with respect to the sample 332 is adjusted. The potentials or currents of the lenses, the deflector, the aberration corrector, and the sample stage controlling the trajectory of the charged particle beam 202 and the operation of the detector 326 detecting the secondary electrons are controlled by the control computer 130 through respective control power sources. In addition, reference numeral 340 denotes a first capacitor lens power source, reference numeral 323 denotes a two-stage deflector, reference numeral 342 denotes a deflector power source, reference numeral 343 denotes an aberration correction coil power source, reference numeral 3431 denotes an aberration correction voltage source, reference numeral 345 denotes an objective lens power source, reference numeral 346 denotes a retarding power source, and reference numeral 350 denotes a secondary electron detector power source.

Figure 4:
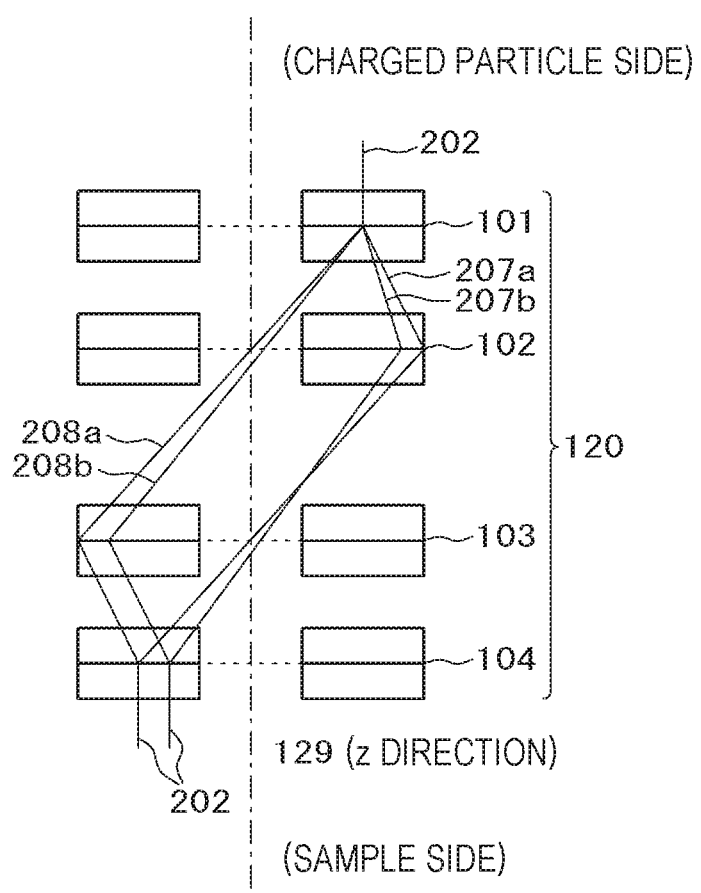
FIG. 4 is a schematic diagram illustrating a trajectory of a charged particle beam in an aberration corrector.

FIG. 4 is an electron optical schematic diagram illustrating a trajectory of the charged particle beam 202 passing through the aberration corrector 120. Since the trajectory of the charged particle beam 202 passing through the aberration corrector 120 varies according to the direction, the trajectory in the x direction is denoted by reference numerals 207a and 207b, and the trajectory in the y direction is denoted by reference numerals 208a and 208b. The aberration corrector 120 is configured with four stages of multipoles 101 to 104. The trajectory of the charged particle beam 202 which has become a parallel beam is separated into an X trajectory and a Y trajectory by a quadrupole field excited by the multipole 101. The charged particle beam that is subjected to a divergence action (x direction) from the multipole 101 is denoted by a trajectory 207a or 207b. On the other hand, the charged particle beam that is subjected to a convergence action (y direction) is taken as a trajectory 208a or 208b. Generally, as illustrated in the trajectories 208a and 207a of the charged particle beam illustrated in FIG. 4, the charged particle beam forms a line cross at the center position (z direction) of the second-stage and third-stage multipoles 102 and 103. After passing through the multipole 104, the X trajectory and the Y trajectory become symmetric trajectories (parallel trajectories) again. A quadrupole field is excited in each of the multipoles 101 to 104 so as to form such a trajectory for aberration correction. On the other hand, in the case where the quadrupole field formed by the multipoles 101 and 102 has a deviation and the trajectory for aberration correction is not constructed, a line cross is formed at the position where the Y trajectory component and the X trajectory component of the charged particle beam are deviated from the center in the direction of the optical axis (129) of the multipoles 102 and 103 according to trajectories 208b and 207b illustrated in FIG. 4. In this case, the optical magnification ratios in the x and y directions on the sample surface deviate from the designed positions as illustrated in FIG. 1.

Figure 5:
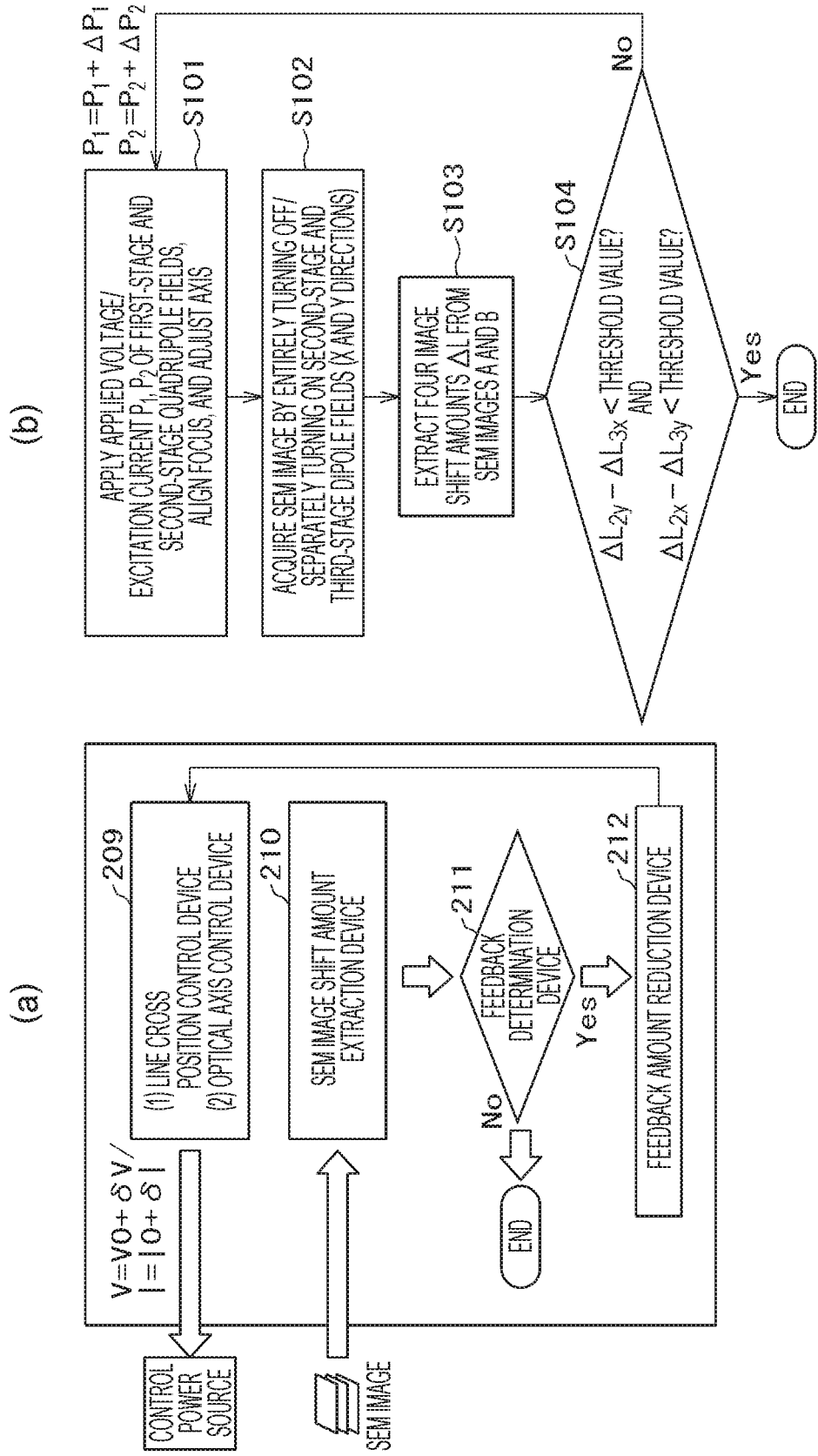
FIGS. 5A and 5B are diagrams illustrating a correction system and an aberration correction method according to the first embodiment of the present invention.

FIG. 5 illustrates a configuration example (FIG. 5A) of a correction system (alignment apparatus) for automatically constructing the trajectory for aberration correction of the charged particle beam in the aberration corrector according to this embodiment and a control flowchart (FIG. 5B) in the aberration correction method. Reference numeral 209 denotes a line cross position/optical axis control device, and a voltage V and a current I for controlling the line cross position and optical axis adjustment are output. Reference numeral 210 denotes an SEM image shift amount extraction device which reads SEM images captured before and after the change in output condition of the line cross position/optical axis control device 209 and calculates an image shift amount caused by the change in the line cross position and the output change of the line cross position/optical axis control device 209 from the SEM images. Reference numeral 211 denotes a feedback determination device which determines based on the shift amount obtained by the SEM image shift amount extraction device 210 whether or not feedback to the line cross position and the control voltage or current of the line cross position/optical axis control device is necessary. In the case where it is determined that the feedback is necessary, the feedback amount calculation device 212 reduces the feedback amount from the shift amount of the SEM image based on the table data for calculating the feedback amount generated in advance and reflects the feedback amount on the output of the line cross position/optical axis control device 209. Thus, it is possible to allow the designed value and the actually measured value of the line cross position to be equal to each other. In addition, the line cross position control device includes a quadrupole wobbling circuit which performs fine movement (wobbling) of intensities of quadrupoles independently of each stage of the multipoles. The image shift amount extraction device includes an axis deviation detection circuit which detects the image shift amount caused by the quadrupole wobbling. The feedback amount calculation device includes a deflection amount calculation circuit which calculates a deflection amount to be fed back to each polarization unit which is configured with the multipoles of the second stage and the third stage and a deflector which adjusts an incident position with respect to the aberration corrector according to the image shift amount caused by the quadrupole wobbling of each stage, and a calculation circuit which calculates a deflection amount to be fed back to each polarization unit including a plurality of multipoles based on the deflection amount. The deflection calculated by the calculation circuit according to the image shift amount is performed in cooperation with a plurality of stages of deflection.

A control flowchart in the aberration correction method according to this embodiment using the apparatus configured as described above will be described (FIG. 5B). In the alignment apparatus illustrated in FIG. 5A, in order to form the line cross in the x and y directions each in the vicinity of the second-stage and third-stage poles, a control voltage or current is output so that voltages or excitation currents P1 and P2 are applied to the first-stage and second-stage quadrupole fields, and a control signal for focusing on the sample surface and optical axis adjustment is output to control the voltage or current applied to each pole field (step S101).

After that, five SEM images are acquired under the condition that the second-stage and third-stage dipole fields (x and y directions) are all OFF and single ON (step S102). Next, four shift amounts of the SEM image newly generated under the condition that each dipole field alone is ON are extracted from the image, and a difference between the shift amount or the deflection sensitivity $\Delta L2y$ in the second stage in the y direction and the shift amount or deflection sensitivity $\Delta L3x$ in the third stage in the x direction and a difference between the shift amount or the deflection sensitivity $\Delta L2x$ in the second stage in the x direction and the shift amount or deflection sensitivity $\Delta L3y$ in the third stage in the y direction are calculated (step S103). The differences are compared with a threshold value, and it is determined whether or not feedback is to be applied to the applied voltage or the excitation current of the first-stage and second-stage quadrupole fields (step S104). In the case where one or more of the two differences is larger than a predetermined threshold value, the feedback is applied to the applied voltage or the excitation current of the first-stage and second-stage quadrupole fields, and otherwise, the feedback is terminated. By repeating such processes, the charged particle beam 202 illustrated in FIG. 4 forms the trajectories 207a and 208a for aberration correction. Thus, it is possible to allow the designed value and the actually measured value of the line cross position to be equal to each other.

Herein, for the construction of the trajectory for aberration correction of the charged particle beam 202, by using the difference in the displacement amount or the deflection sensitivity of the SEM image caused by the dipole field in the line cross direction and in the direction perpendicular to the line cross direction in the vicinity of the second-stage and third-stage multipoles illustrated in FIG. 4, the position of the line cross in the optical axis direction is controlled. However, the present invention is not limited thereto, and by using any two of the nine items (1) to (9) illustrated in FIG. 5, it can also be determined whether or not the feedback is necessary.

Figure 3:
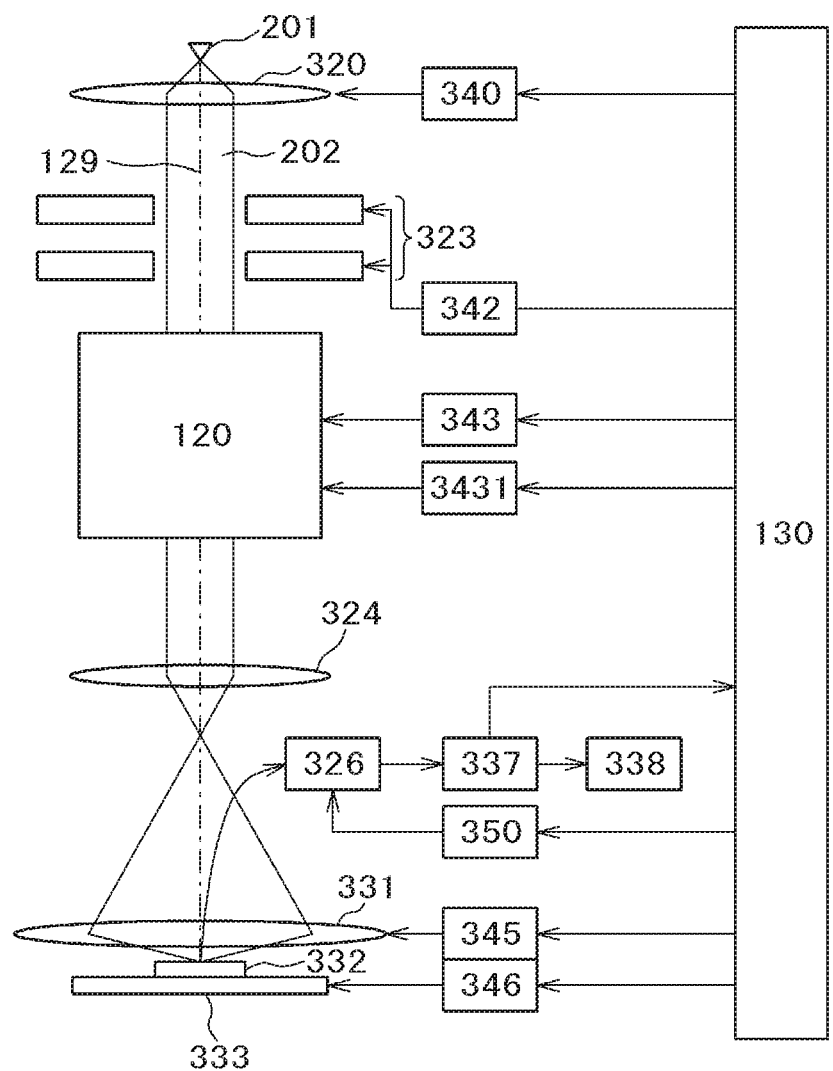
FIG. 3 is a schematic overall configuration diagram illustrating a charged particle beam apparatus (scanning electron microscope equipped with a chromatic/spherical aberration corrector) according to a first embodiment of the present invention.

The charged particle beam apparatus illustrated in FIG. 3 equipped with the correction system illustrated in FIG. 5A and the correction method illustrated in FIG. 5B are used. However, even in the case where there is interference between the stages of the aberration corrector, the designed value and the actually measured value of the line cross position can be allowed to be equal to each other, so that it is possible to form the charged particle beam having no anisotropy on the sample surface, and it is possible to obtain a high-resolution, high-precision image with a fine pattern.

As described above, according to this embodiment, even in the case where there is magnetic interference between pole stages of an aberration corrector, it is possible to provide an aberration correction method, an aberration correction system, and a charged particle beam apparatus for realizing a charged particle beam of which anisotropy is reduced or eliminated on a sample surface.

Second Embodiment

A charged particle beam apparatus and an aberration correction method according to a second embodiment of the present invention will be described. The contents described in the first embodiment which are not described in this embodiment can also be applied to this embodiment as long as there is no particular circumstance.

Figure 6:
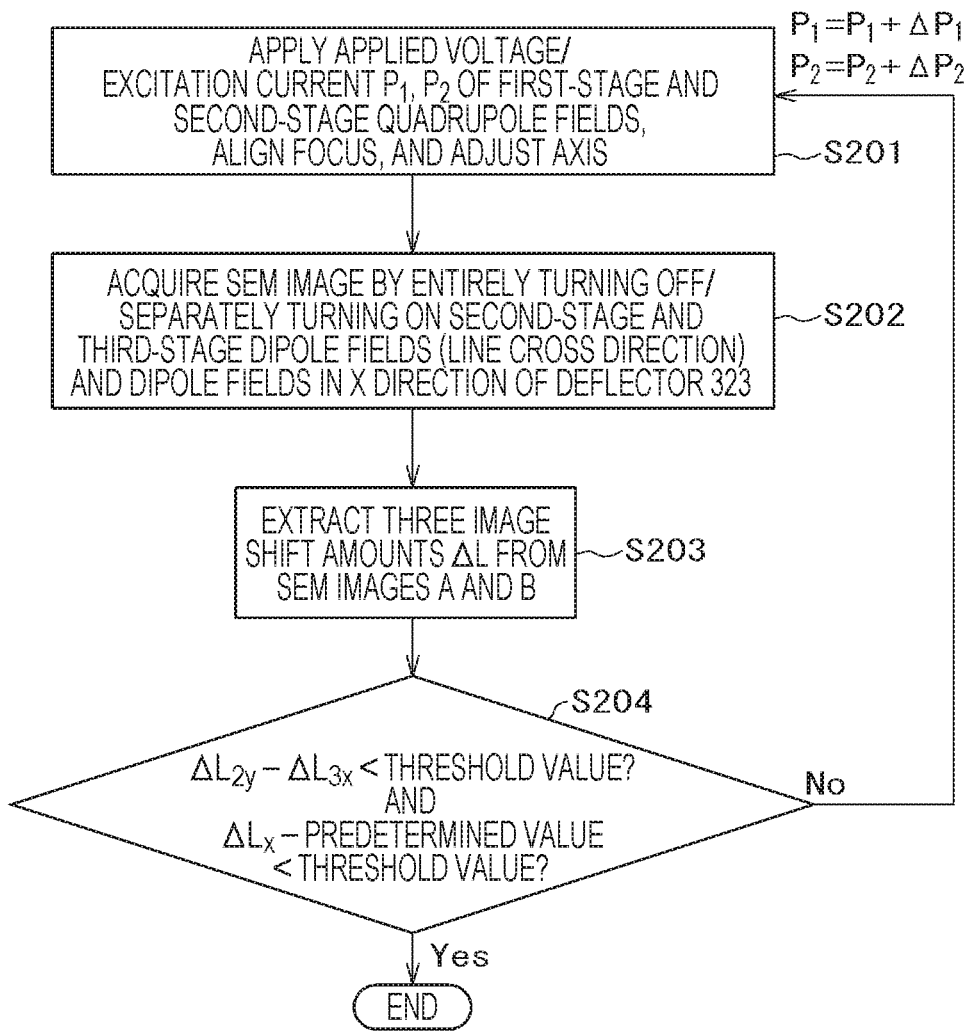
FIG. 6 is a diagram illustrating a control flowchart in an aberration correction method according to a second embodiment of the present invention.

This embodiment will be described with reference to the configuration diagram illustrated in FIG. 3. An adjustment method using the deflection function of the two-stage deflector 323 and the aberration corrector 120 for constructing a charged particle trajectory for aberration correction will be described as an example. FIG. 6 illustrates a control flowchart in the correction method according to this embodiment. As illustrated in FIG. 6, in order to form the line cross in the x and y directions in the vicinity of the second-stage and third-stage poles, a control voltage or current is output so that voltage or excitation currents P1 and P2 are applied to the first-stage and second-stage quadrupole fields, and a control signal for focusing on the sample surface and optical axis adjustment is output to control the voltage or current applied to each pole field (S201). After that, at least four SEM images are acquired under the condition that the dipole fields in the second-stage x direction and the third-stage y direction (the respective line cross parallel directions) and the x-direction dipole fields of the deflector 323 are all OFF and single ON (S202). Next, from the image, three shift amounts of the SEM image newly generated under the condition that each dipole field alone is ON are extracted from the image, and a difference between the shift amount or deflection sensitivity ΔL2y in the second stage in the y direction and the shift amount or deflection sensitivity ΔL3x in the third stage in the x direction and a difference between the shift amount or deflection sensitivity ΔLx in the x direction of the deflector 323 and a predetermined value (depending on optical conditions) are calculated (S203). The differences are compared with a predetermined threshold value, and it is determined whether or not feedback is to be applied to the applied voltage or the excitation current of the first-stage and second-stage quadrupole fields (S204). In addition, in step S203, three shift amounts of the SEM image newly generated under the condition that each dipole field alone is ON are extracted from the image, and a difference between the shift amount or deflection sensitivity ΔL2x in the second stage in the x direction and the shift amount or deflection sensitivity ΔL3y in the third stage in the y direction and a difference between the shift amount or deflection sensitivity ΔLx in the x direction of the deflector 323 and a predetermined value (depending on optical conditions) may be calculated. In the case where one or more of the two differences is larger than a predetermined threshold value, the feedback is applied to the applied voltage or the excitation current of the first-stage and second-stage quadrupole fields, and otherwise, the feedback is terminated. By repeating such processes, the charged particle beam 202 illustrated in FIG. 4 forms the trajectories 207a and 208a for aberration correction in the alignment apparatus (FIG. 5A). Thus, it is possible to allow the designed value and the actually measured value of the line cross position to be equal to each other.

Herein, by using the difference between the shift amount or deflection sensitivity ΔL2y in the second stage in the y direction and the shift amount or deflection sensitivity ΔL3x in the third stage in the x direction (or the difference between the shift amount or deflection sensitivity ΔL2x in the second stage in the x direction and the shift amount or deflection sensitivity ΔL3y in the third stage in the y direction) and the difference between the shift amount or deflection sensitivity ΔLx in the x direction of the deflector 323 and a predetermined value (depending on optical conditions), the position of the line cross in the optical axis direction is controlled. However, the present invention is not limited thereto, and by using any two of the nine items (1) to (9) illustrated in FIG. 5, it can also be determined whether or not the feedback is necessary.

The charged particle beam apparatus illustrated in FIG. 3 equipped with the correction system illustrated in FIG. 5A and the correction method illustrated in FIG. 6 are used. However, even in the case where there is interference between the stages of the aberration corrector, the designed value and the actually measured value of the line cross position can be allowed to be equal to each other, so that it is possible to form the charged particle beam having no anisotropy on the sample surface, and it is possible to obtain a high-resolution, high-precision image with a fine pattern.

As described above, according to this embodiment, even in the case where there is magnetic interference between pole stages of an aberration corrector, it is possible to provide an aberration correction method, an aberration correction system, and a charged particle beam apparatus for realizing a charged particle beam of which anisotropy is reduced or eliminated on a sample surface.

Third Embodiment

A charged particle beam apparatus and an aberration correction method according to a third embodiment of the present invention will be described. In addition, the contents described in first and second embodiments which are not described in this embodiment can also be applied to this embodiment as long as there is no particular circumstance.

Figure 7:
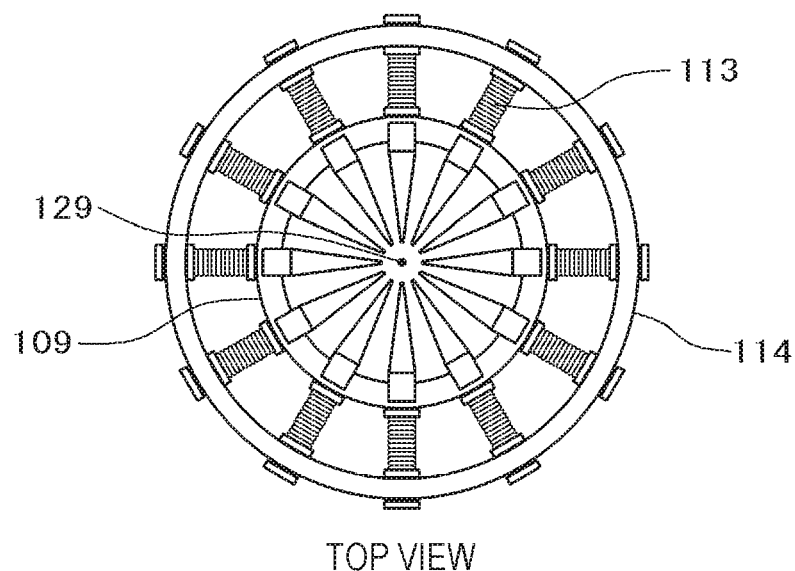
FIG. 7 is a diagram illustrating an example of a structure of a chromatic/spherical aberration corrector in a correction system or a charged particle beam apparatus according to a third embodiment of the present invention, the upper diagram illustrates a top view, and the lower diagram illustrates a cross-sectional view.
Figure 7:
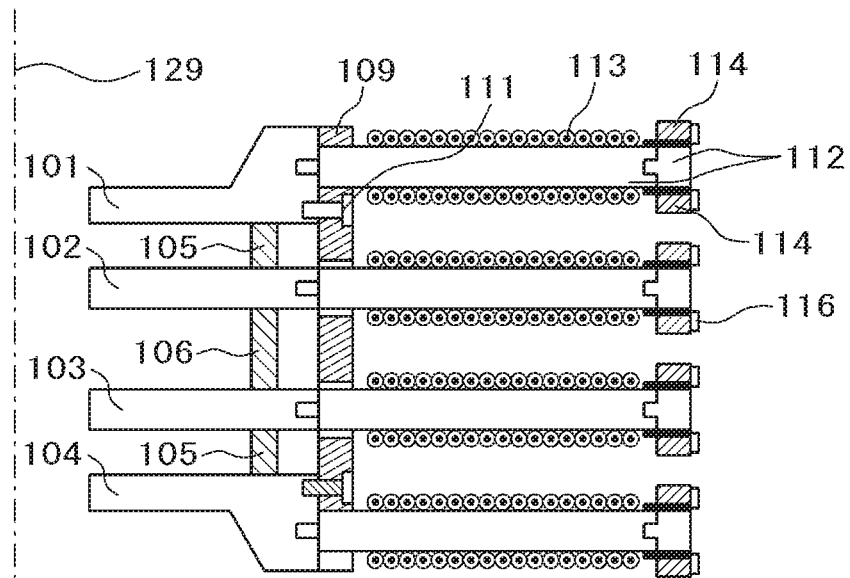
Figure 8:
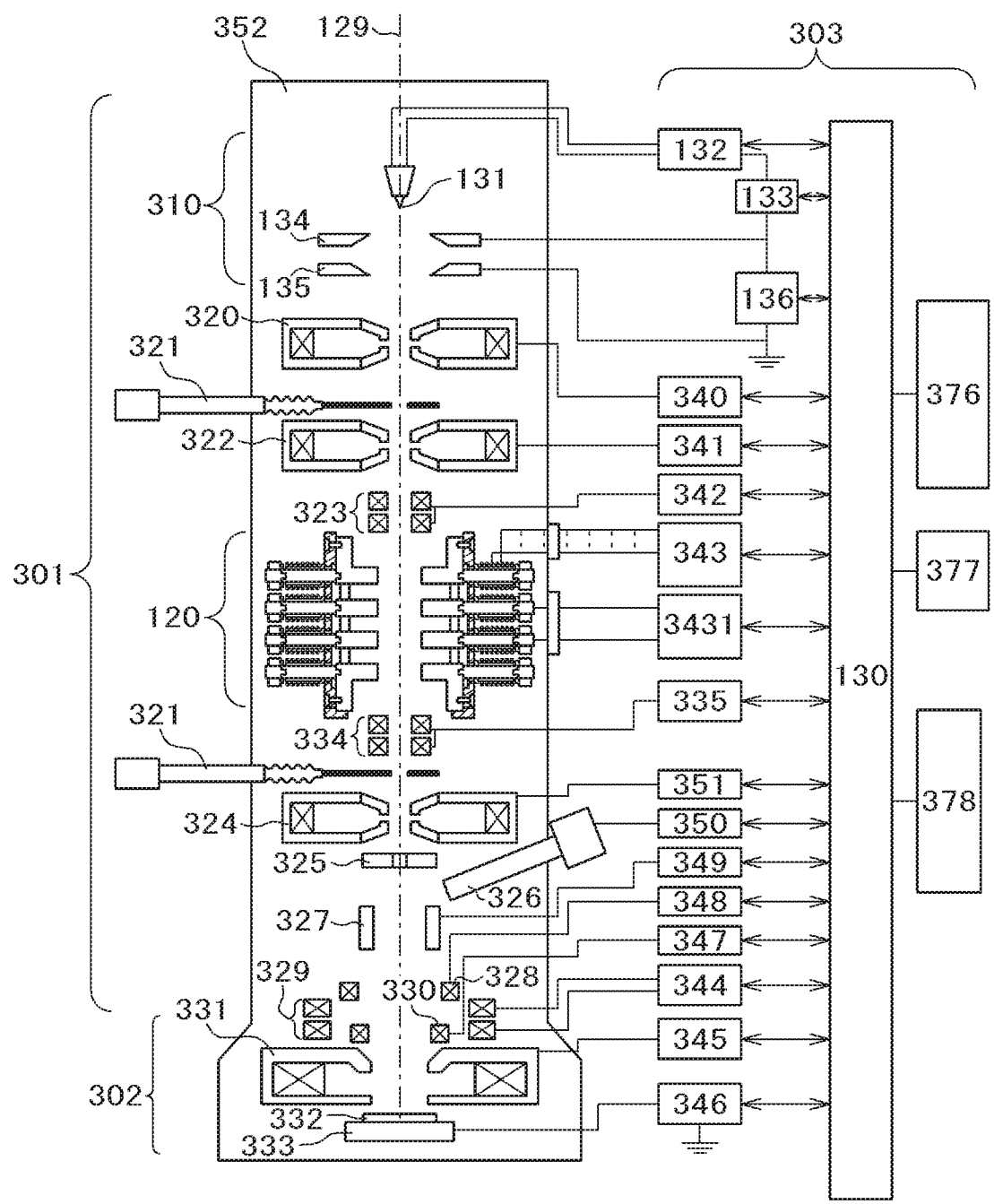
FIG. 8 is a schematic overall configuration view illustrating a charged particle beam apparatus according to a third embodiment of the present invention (a scanning electron microscope equipped with a chromatic/spherical aberration corrector illustrated in FIG. 7).

FIG. 7 illustrates an example of a chromatic/spherical aberration corrector in the charged particle beam apparatus according to this embodiment, the upper diagram illustrates a top diagram, and the lower diagram illustrates a cross-sectional diagram. FIG. 8 illustrates an example where the chromatic/spherical aberration corrector is accommodated in a vacuum container and incorporated into a scanning electron microscope (hereinafter, referred to as an SEM). In addition, in FIG. 7, reference numerals 105 and 106 denote alumina supports, reference numeral 109 denotes a cylindrical housing, reference numeral 111 denotes a screw, reference numeral 112 denotes a shaft, reference numeral 113 denotes coils, reference numeral 114 denotes an outer magnetic path ring (magnetic yoke), and reference numeral 116 denotes a: gap adjustment member.

The SEM illustrated in FIG. 8 includes an SEM column 301 for irradiating or scanning an electron beam on a sample, a sample chamber 302 for accommodating a sample stage 333, a control unit 303 for controlling each component of the SEM column 301 and the sample chamber 302, and the like. The illustration and description of an ion pump, a turbo molecular pump, vacuum piping, and a vacuum system control mechanism are omitted herein. The control unit 303 is further connected with a data storage 376 for storing predetermined information, a monitor 377 for displaying the acquired image, and an operation console 378 as an interface between the apparatus and a user of the apparatus. The operation console 378 is configured with information input means such as a keyboard and a mouse.

First, the components inside the SEM column 301 will be described. A field emission electron source 131 is an electron source sharpened by polishing the tip of a single crystal of tungsten by electric field polishing. After the surface thereof is cleaned through conducting and heating by a flushing power source 132, a voltage of about +5 kV is extracted the field emission electron source and an electrode (first anode) 144 in an ultrahigh vacuum of the order of $10^{-8}$ Pa, and the voltage is applied to a power source 133, so that field emission electrons are emitted. The electrons accelerated and converged by the electrostatic lens formed between the extraction electrode (first anode) 144 and a second anode 135 are incident on a component of the subsequent stage along the optical axis 129. Reference numeral 310 denotes a field emission electron gun. After that, the electrons are converged by the first condenser lens 320, and the beam amount is limited by a movable diaphragm 321. The electrons pass through the second condenser lens 322 and the two-stage deflector 323 to be incident on the aberration corrector 120. The two-stage deflector 323 is adjusted so that the axes of the field emission electron gun 131 and the condenser lenses 320 and 322 coincide with the axis of the aberration corrector 120. The beam emitted from the aberration corrector 120 is adjusted by the two-stage deflector 334 so as to coincide with the optical axes of the adjustment lens 324 and the objective lens 331. In addition, depending on the setting conditions of the first condenser lens 320, the second condenser lens 322 is not necessarily required.

Next, the operation of the aberration corrector will be described. The aberration corrector 120 according to this embodiment is a quadrupole-octupole aberration corrector and can correct chromatic aberration and spherical aberration. In each stage of the aberration corrector 120, a quadrupole and an octupole element are formed. If a dodecapole (which may also serve as an electrode) is used as a magnetic pole for the stage, the magnetic pole can also be formed by overlapping a dipole, a hexapole, or a dodecapole instead of the quadrupole and the octupole. These multipole fields are used to correct parasitic aberrations such as an axial coma aberration, three-fold astigmatism, or four-fold astigmatism caused by assembly errors of electrodes and magnetic poles, non-uniformity of a magnetic pole material.

The electron beam of which angle according to a separation axis corresponding to canceling the chromatic aberration and the spherical aberration of the objective lens 331 mainly by the aberration corrector 120 is focused at a time to the vicinity of the ExB deflector 327 by the adjustment lens 324. The crossover is formed in the vicinity of the ExB deflector in order to reduce the influence of the aberration of the ExB deflector 327. In addition, the adjustment lens 324 also suppresses an increase in chromatic aberration, fourth-order chromatic/spherical combinational aberration and fifth-order spherical aberration after spherical aberration correction. Therefore, in order to obtain a high-resolution image through the aberration correction, the adjustment lens 324 is required. After that, the electron beam is focused on the sample 332 by the objective lens 331 and is scanned over the sample by the scanning deflector 329. Reference numeral 328 denotes an object aligner, and reference numeral 330 denotes an astigmatic correction coil.

A sample stage 333 having a sample mounting surface on which the sample 332 is mounted is accommodated inside the sample chamber 302. Secondary charged particles (in this case, secondary electrons or reflected electrons) generated by electron beam irradiation pass through the objective lens 331 and hit the reflecting plate 325 to generate secondary particles. The generated electrons are detected by the secondary electron detector 326. The ExB deflector 327 bends the trajectory of the secondary electrons generated from the sample and directly guides the secondary electrons to the secondary electron detector 326 or adjusts the position where the secondary electrons generated from the sample collide the reflecting plate 325 to improve the detection efficiency. The detected secondary electron signal is acquired by the control computer 130 as a luminance signal synchronized with the scanning. The control computer 130 performs an appropriate process on the acquired luminance signal information and displays the information as an SEM image on the monitor 377. Although only one secondary electron detector 326 is illustrated herein, a plurality of the secondary electron detectors 326 may be arranged so that energy and angular distribution of reflected electrons and secondary electrons can be selected and images can be acquired. If a coaxial disk-shaped secondary electron detector with a hole at the center thereof is arranged on the optical axis 129, the reflecting plate 325 is not necessarily required.

The control unit 303 includes a flushing power source 132, an extraction power source 133, an acceleration power source 136, a deflector power source 335, a first condenser lens power source 340, a second condenser lens power source 341, a deflector power source 342, an aberration correction coil power source 343, an aberration correction voltage source 3431, a scanning coil power source 344, an objective lens power source 345, a retarding power source 346, an astigmatism correction coil power source 347, an object aligner power source 348, an ExB deflector power source 349, a secondary electron detector power source 350, an adjustment lens power source 351, and the like, and these components each are connected to the corresponding components in the SEM column through signal transmission lines, electric wirings, and the like.

Since the vacuum container 352 also serves as a magnetic shield, the vacuum container may be made of a soft magnetic metal such as a permalloy, or the vacuum container may be made of a nonmagnetic metal with a magnetic shield being formed as a permalloy thin plate on the surface. A coil power source is connected to the aberration corrector 120 so as to form a quadrupole and an octupole in each stage. In the coils 113 (refer to FIG. 7), coils for forming the quadrupole and coils for forming the octupole may be wound separately from each other. In this case, a quadrupole coil power source and an octupole coil power source are prepared independently. In the case where the coils are not separately wound, one coil power source corresponds to each pole, the control computer 130 calculates an output current of the coil power source of each pole so as to form a quadrupole field or an octupole field and outputs the current to the aberration correction coil power source 343. In addition, the voltages applied to the second-stage and third-stage poles are similarly calculated by the control computer 130 and output by the aberration correction voltage source 3431.

In order to determine the aberration adjustment amount of the aberration corrector 120, it is necessary to measure the aberration of the electron optical system before correcting the aberration. For this reason, the beam is moved by the two-stage deflector 323 around the optical axis of the aberration corrector at a constant azimuth angle (for example, divided by 12 at intervals of 30° or the like), and the SEM image in each case is analyzed, so that the aberration can be measured. The plurality of SEM image data are acquired by the control computer 130, and the aberration is calculated. Next, the control computer 130 calculates the outputs of the aberration correction coil power source 343 and the aberration correction voltage source 3431 so as to cancel the calculated aberration and issues an instruction to the power sources to correct the aberration. The aberration is measured again, the aberration correction amount is calculated based on that value, and the aberration correction amount is output to the power sources. These processes are repeated several times manually or automatically, and if all aberration amounts of the system fall below preset threshold values, the aberration correction is completed. It is known that influence of the fifth-order aberration can be suppressed to a small value by projecting the image of the main surface of the fourth-stage poles of the aberration corrector 120 onto the main surface of the objective lens 331 as one of the setting conditions of the adjustment lens 324. Actually, since the influence of the fifth-order aberration greatly changes depending on the balance with the beam aperture angle, it is not necessary to strictly operate the adjustment lens 324 under the above-described condition, and it may be operated under a condition close to the above-described condition.

The charged particle beam apparatus illustrated in FIG. 8 equipped with the aberration corrector illustrated in FIG. 7 and the correction system illustrated in FIG. 5A and the correction method illustrated in FIG. 5B or FIG. 6 are used. However, even in the case where there is interference between the stages of the aberration corrector, the designed value and the actually measured value of the line cross position can be allowed to be equal to each other, so that it is possible to form the charged particle beam having no anisotropy on the sample surface, and it is possible to obtain a high-resolution, high-precision image with a fine pattern.

As described above, according to this embodiment, even in the case where there is magnetic interference between pole stages of an aberration corrector, it is possible to provide an aberration correction method, an aberration correction system, and a charged particle beam apparatus for realizing a charged particle beam of which anisotropy is reduced or eliminated on a sample surface.

Fourth Embodiment

A charged particle beam apparatus and an aberration correction method according to a fourth embodiment of the present invention will be described. In addition, the contents described in first and second embodiments which are not described in this embodiment can also be applied to this embodiment as long as there is no particular circumstance.

Figure 9:
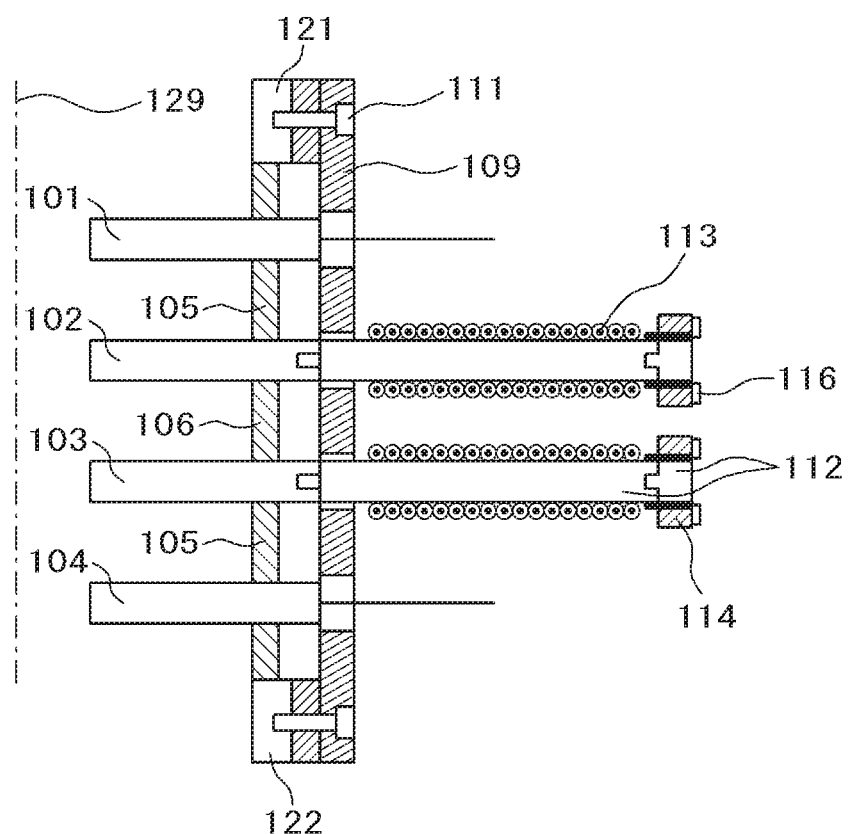
FIG. 9 is a cross-sectional view illustrating an example of a structure of a chromatic/spherical aberration corrector in a correction system and a charged particle beam apparatus according to a fourth embodiment of the present invention.

FIG. 9 illustrates a chromatic/spherical aberration corrector mainly configured with electric field quadrupoles of four stages of twelve poles and in the charged particle beam apparatus according to this embodiment. In this case, since it is necessary that all the poles of the four stages are insulated, as solder pole members, fixture metal fittings 121 and 122 are added above and below the four poles. This insulates all the four poles from the housing. The first and fourth stages are connected only to the voltage source, the poles of the second-stage and third-stages are electromagnetic field composite poles, and the coil for generating the magnetic field is arranged inside the outer magnetic path ring 114. Frames (alumina supports) 105 and 106 are fitted into the holes of the outer magnetic path ring 114 through the insulating sleeve (space adjustment member) 116 and are connected to the shaft 112. The magnetic field passing through the poles moves around the outer magnetic path ring 114 to form a magnetic circuit. The second-stage and third-stage poles are insulated from an outer magnetic path, a mirror body, and other poles by the insulating sleeve 116. In this manner, a chromatic/spherical aberration corrector including electric field quadrupole as a main component is formed.

Figure 10:
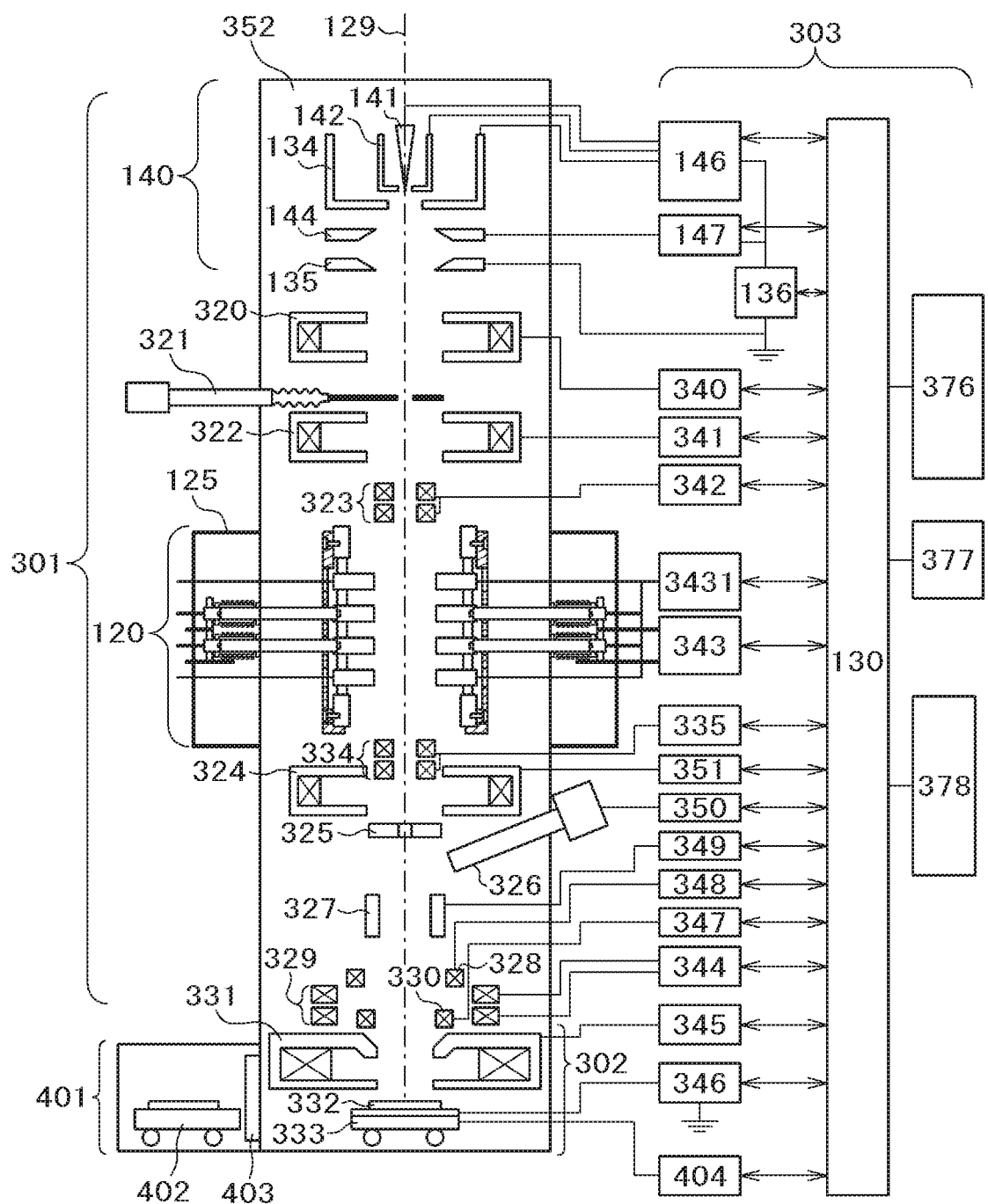
FIG. 10 is a schematic overall configuration diagram illustrating the charged particle beam apparatus according to the fourth embodiment of the present invention (a scanning electron microscope equipped with a chromatic/spherical aberration corrector illustrated in FIG. 9).

FIG. 10 is a schematic overall configuration diagram illustrating a scanning electron microscope equipped with the aberration corrector of FIG. 9. Herein, an example in which the rear stage pole (shaft) 112 and the outer magnetic path ring 114 of the aberration correction unit of FIG. 9 are put out of the vacuum is illustrated. Although this requires a large magnetic shield 125, the coil of the heat source is naturally cooled, and the thermal drift of the magnetic pole is reduced. Moreover, since it is possible to access the coil, there is a characteristic in that maintenance such as disconnection repair of the coil and change of winding number becomes easy. Since the configuration illustrated in FIG. 10 has many components in common with the configuration in FIG. 8, only the components having different structures will be described. In this embodiment, a Schottky electron gun 140 is used. A Schottky electron source 141 is an electron source which is formed by diffusing oxygen, zirconium, and the like into a single crystal of tungsten and uses a Schottky effect, and a suppressor electrode 142 and an extraction electrode 134 are provided in the vicinity thereof. By heating the Schottky electron source 141 and applying a voltage of about +2 kV between the Schottky electron source 141 and the extraction electrode 134, Schottky electrons are emitted. A negative voltage is applied to the suppressor electrode 142 to suppress electron emission from other than the tip of the Schottky electron source 141. In comparison with the field emission electron gun, the energy width and the light source diameter become large, but the probe current can be large, so that there is no need for flushing, and thus, the Schottky electron source is suitable for continuous operation. Reference numerals 146 and 147 denote power sources for electron gun.

In the scanning electron microscope according to this embodiment, it is possible to measure a resist pattern and the like on a semiconductor wafer, and from the viewpoint of sample damage, the landing energy suppressed to 1 keV or less is usually used. In addition, the operating condition of the aberration corrector, the retarding voltage value, and the like corresponding to two or three observation modes having a constant working distance and different landing energy are stored in the data storage 376, and according to the operator's selection, the control computer 130 invokes the selected operating condition, sets the condition of each power source, and executes the observation mode. A sample preparation chamber 401 for loading a wafer is provided in the sample chamber 302, and the wafer sample 332 is set on the sample stage 333 by a sample transport mechanism 402 through a gate valve 403. With respect to measurement points previously input, the control computer 130 controls a sample stage control mechanism 404 to move the stage, performs focusing with the objective lens 331, corrects astigmatism by the astigmatism correction coil 330, and controls the scanning deflector 329, the secondary electron detector 326, and the like to automatically perform operations such as length measurement, data recording, image acquisition, and data storage. In addition, needless to say, it is also possible to use the magnetic field-based type aberration corrector illustrated in FIG. 7 instead of the aberration corrector illustrated in FIG. 9. In addition, depending on the setting conditions of the first condenser lens 320, the second condenser lens 322 is not necessarily required.

The charged particle beam apparatus illustrated in FIG. 10 equipped with the aberration corrector illustrated in FIG. 9 and the correction system illustrated in FIG. 5A and the correction method illustrated in FIG. 5B or FIG. 6 are used. However, even in the case where there is interference between the stages of the aberration corrector, the designed value and the actually measured value of the line cross position can be allowed to be equal to each other, so that it is possible to form the charged particle beam having no anisotropy on the sample surface, and it is possible to obtain a high-resolution, high-precision image with a fine pattern.

As described above, according to this embodiment, even in the case where there is magnetic interference between pole stages of an aberration corrector, it is possible to provide an aberration correction method, an aberration correction system, and a charged particle beam apparatus for realizing a charged particle beam of which anisotropy is reduced or eliminated on a sample surface.

Fifth Embodiment

A charged particle beam apparatus according to a fifth embodiment of the present invention and an aberration correction method will be described. In addition, the contents described in first and second embodiments which are not described in this embodiment can also be applied to this embodiment as long as there is no particular circumstance.

Figure 11:
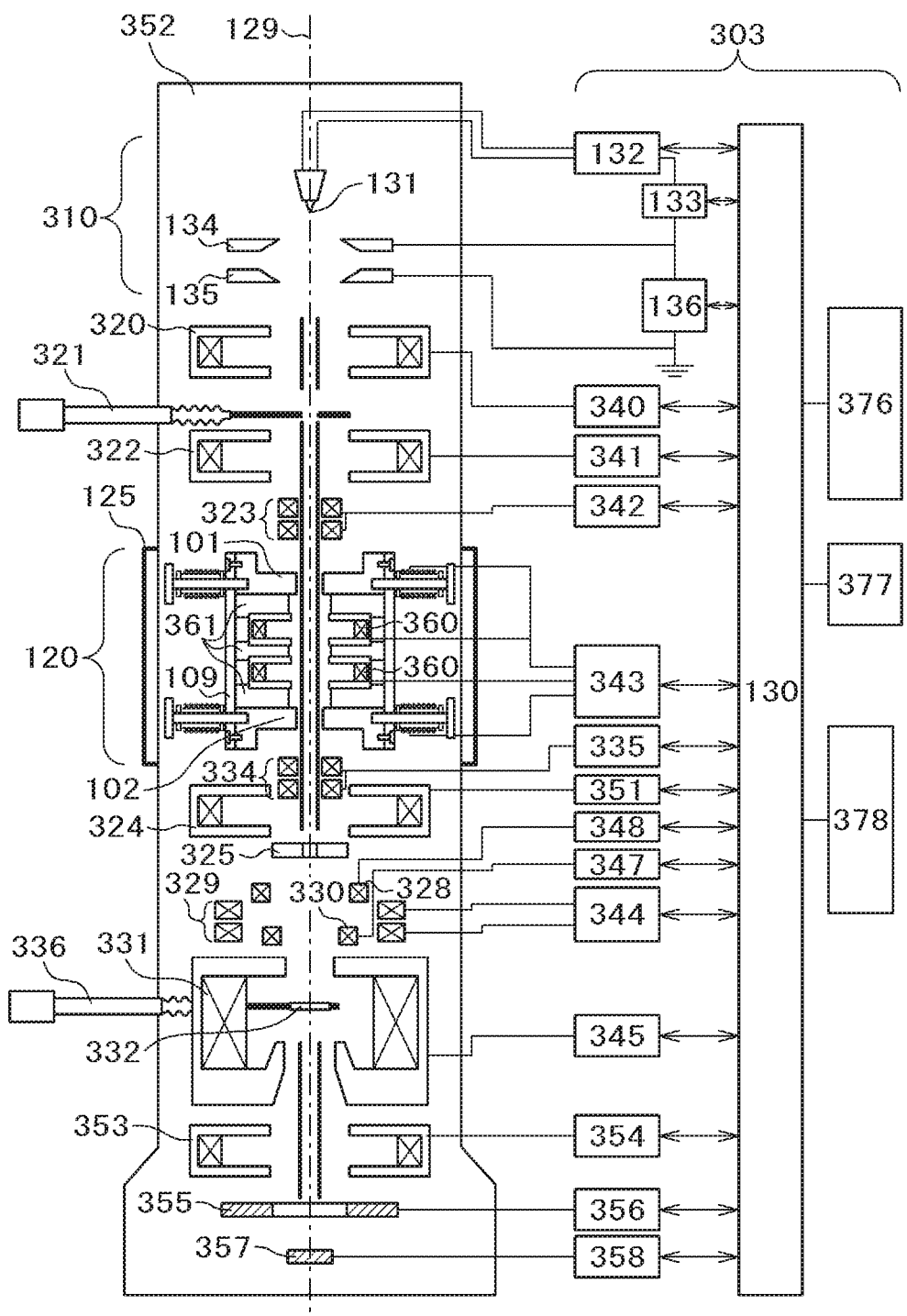
FIG. 11 is a schematic overall configuration diagram illustrating a charged particle beam apparatus (scanning transmission electron microscope equipped with a chromatic/spherical aberration corrector) according to a fifth embodiment of the present invention.

FIG. 11 illustrates a schematic overall configuration diagram illustrating the scanning transmission electron microscope (STEM) according to this embodiment. The charged particle optical column for STEM includes an electron gun 310 for generating an electron beam and emitting the electron beam at a predetermined acceleration voltage, a scanning deflector 329 for scanning the electron beam on the sample 332, an objective lens 331 for focusing and irradiating the electron beam on the sample, an annular detector 355 for detecting the electron beam transmitted through the sample, an on-axis detector 357, and the like. Since it is necessary to detect transmitted electrons, the sample for the STEM needs to be flaked, and the sample is arranged on the optical axis of the electron beam by a side entry sample holder 336 in a state fixed to a mesh or the like.

In an STEM with high acceleration voltage, the resolution is mainly limited by spherical aberration as comparison with chromatic aberration, and in the case where only the spherical aberration is corrected, there is no need to use an electromagnetic superposition pole, and all magnetic field type multipoles are used. For example, an STEM spherical aberration corrector is arranged between the electron gun and the objective lens. The aberration corrector 120 of this embodiment is a spherical aberration corrector having a configuration in which two stages including upper and lower hexapoles (or a dodecapole) and a transfer lens 360 are arranged therebetween. As described above, the positioning of the upper and lower poles is performed by fitting square grooves of the cylindrical housing 109 and the poles 101 and 102. The positions of the two transfer lenses 360 are determined by three spacers 361. The spacer 361 is provided with quadrangular protrusions fitted into the square grooves of the cylindrical housing 109, and it is easy to assemble. In addition, depending on the setting conditions of the first condenser lens 320, the second condenser lens 322 is not necessarily required. Reference numeral 353 denotes a projection lens, reference numeral 354 denotes a projection lens power source, reference numeral 356 denotes an annular detector power source, and reference numeral 358 denotes an on-axis detector power source.

The scanning transmission electron microscope (charged particle beam apparatus) illustrated in FIG. 11 equipped with the correction system illustrated in FIG. 5A and the correction method illustrated in FIG. 5B or FIG. 6 are used. However, even in the case where there is interference between the stages of the aberration corrector, the designed value and the actually measured value of the line cross position can be allowed to be equal to each other, so that it is possible to form the charged particle beam having no anisotropy on the sample surface, and it is possible to obtain a high-resolution, high-precision image with a fine pattern.

As described above, according to this embodiment, even in the case where there is magnetic interference between pole stages of an aberration corrector, it is possible to provide an aberration correction method, an aberration correction system, and a charged particle beam apparatus for realizing a charged particle beam of which anisotropy is reduced or eliminated on a sample surface.

In addition, the present invention is not limited to the above-described embodiments, but the present invention includes various modified examples. For example, the above embodiments have been described in detail in order to explain the present invention for the better understanding of the present invention, and the present invention is not necessarily limited to those having all the described configurations. In addition, some configurations of any one embodiment may be replaced with other configurations of another embodiment, and a configuration of another embodiment may be added to a configuration of one embodiment. In addition, other configurations may be added, deleted, or replaced with respect to a portion of the configurations of each embodiment.

The present invention also includes the following contents as embodiments.

(1) A charged particle beam apparatus, including: an aberration corrector configured with two or more stages of multipoles which control aberration of the charged particle beam, first and second deflection units (the multipoles, electrodes, magnetic poles, or coils) which cause a deflection action in at least two directions, a determination unit which determines whether or not to change an excitation amount (applied voltage or excitation current) of at least one quadrupole field configured with the multipoles, a calculation circuit which calculates a feedback amount with respect to the excitation amount of the quadrupole field when the determination of the determination unit is necessary, and a control unit which includes a table data for calculating the feedback amount and changes the excitation amount of the quadrupole field according to the deflection amount or deflection sensitivity by the calculation circuit which calculates the feedback amount, wherein the charged particle beam apparatus further includes a detection circuit which detects an image shift amount caused by the first deflection unit and the second deflection unit and a measurement unit which measures two or more deflection amounts or deflection sensitivities of the deflection units from the shift amount in different directions, and wherein the excitation amount of the quadrupole field is changed through the determination unit based on the deflection amounts or deflection sensitivities in the different directions of the first deflection unit and the second deflection unit obtained by the measurement unit.

(2) In the charged particle beam apparatus according to (1), the charged particle beam apparatus includes the first and second deflection units which cause the deflection action in at least two perpendicular directions (hereinafter, abbreviated as direction x and direction y), a detection circuit which detects an image shift amount caused by the first deflection unit and the second deflection unit, a measurement unit which measures deflection sensitivities in the x and y directions from the shift amount, the determination unit which determines based on the deflection sensitivities in the x and y directions of the respective deflection units obtained by the measurement unit whether or not to change the excitation amount (applied voltage or excitation current) of at least one quadrupole field configured with the multipoles, the calculation circuit which calculates the feedback amount with respect to the excitation amount of the quadrupole field when the determination of the determination unit is necessary, and the control unit which includes the table data for calculating the feedback amount and has a function of changing the excitation amount of the quadrupole field so that at least two or more among the following items are smaller than predetermined threshold values with respect to the deflection sensitivity in the calculation circuit which calculates the feedback amount, (i) (deflection sensitivity of the first deflection unit in the y direction)−(deflection sensitivity of the second deflection unit in the x direction), (ii) (deflection sensitivity of the first deflection unit in the x direction)−(deflection sensitivity of the second deflection unit in the y direction), (iii) (deflection sensitivity of the first deflection unit in the x direction)−(deflection sensitivity of the first deflection unit in the y direction), (iv) (value of deflection sensitivity of the first deflection unit in the y direction)−predetermined value (depending on optical conditions)), (v) (value of deflection sensitivity of the second deflection unit in the x direction)−(predetermined value (depending on optical conditions)), (vi) (value of deflection sensitivity of the first deflection unit in the x direction)−(predetermined value (depending on optical conditions)), and (vii) (value of deflection sensitivity of the second deflection unit in the y direction)−(predetermined value (depending on optical conditions)).

(3) In the charged particle beam apparatus according to (2), the charged particle beam apparatus includes a deflector which deflects the charged particle beam and adjusts an incident position with respect to the aberration corrector, a quadrupole wobbling circuit which performs fine movement (wobbling) of intensities of quadrupoles independently of each stage of the multipoles, an axis deviation detection circuit which detects the image shift amount caused by the quadrupole wobbling, a deflection amount calculation circuit which calculates a deflection amount to be fed back to the deflector configured with multipoles and a deflector which adjusts an incident position with respect to the aberration corrector according to the image shift amount caused by the quadrupole wobbling of each stage, and a calculation circuit which calculates a deflection amount to be fed back to the deflector configured with a plurality of the multipoles based on the deflection amount, wherein deflection calculated according to the image shift amount in the amount calculation circuit is performed in cooperation with a plurality of stages of deflection.

(4) In the charged particle beam apparatus according to (2) or (3), the charged particle beam apparatus includes the aberration corrector configured with four stages of the multipoles which control the aberration of the charged particle beam, the deflector including the multipoles of the second stage and the third stage which cause a deflection action in at least two perpendicular directions (x, y), the detection circuit which detects the image shift amount caused by the deflectors of the second stage and the third stage, the measurement unit which measures the respective deflection sensitivities from the shift amount, the determination unit which determines based on a difference between the deflection sensitivities in the x direction of the second stage and the y direction of the third stage obtained by the measurement unit and a difference between the deflection sensitivities in the y direction of the second stage and the x direction of the third stage whether or not to change the excitation amount (applied voltage or excitation current) of at least one quadrupole field among the quadrupole fields of the first stage and the second stage, the calculation circuit which calculates the feedback amount with respect to the excitation amount of the quadrupole field when the determination of the determination unit is necessary, and the control unit which includes the table data for calculating the feedback amount and changes the excitation amount of the quadrupole field according to the differences between the deflection sensitivities in the calculation circuit which calculates the feedback amount.

(5) In the charged particle beam apparatus according to (4), the excitation amount (applied voltage or excitation current) of at least one quadrupole field among the quadrupole fields of the first stage and the second stage is changed so that the difference between the deflection sensitivities in the x direction of the second stage and the y direction of the third stage and the difference between the deflection sensitivities in the y direction of the second stage and the x direction of the third stage are smaller than predetermined threshold values.

(6) In the charged particle beam apparatus according to (4), the excitation amount (applied voltage or excitation current) of at least one quadrupole field among the quadrupole fields of the first stage and the second stage is changed so that the difference between the deflection sensitivities in the x direction of the second stage and the y direction of the third stage and predetermined values and the difference between the deflection sensitivities in the y direction of the second stage and the x direction of the third stage and predetermined values are smaller than predetermined threshold values.

(7) In the charged particle beam apparatus according to (2), the charged particle beam apparatus includes the aberration corrector configured with four stages of multipoles which controls the aberration of the charged particle beam, a deflector A which deflects the charged particle beam and adjusts at least two perpendicular directions (x', y') at an incident position with respect to the aberration corrector, deflectors (referred to as B and C, respectively) configured with multipoles of the second stage and the third stage which cause the deflection action in at least two perpendicular directions (x, y), the detection circuit which detects the image shift amount caused by the deflector A, the measurement unit which measures the deflection sensitivity from the shift amount, the determination unit which determines based on one or more of a difference between the deflection sensitivity in the x direction of the deflector B of the second stage obtained in the same method as described above and the deflection sensitivity in the y direction of the C deflector of the third stage and a difference between the deflection sensitivity in the y direction of the deflector B of the second stage and the deflection sensitivity in the x direction of the C deflector of the third stage in addition to the deflection sensitivities in the two perpendicular directions (for example, x' and y' directions) obtained by the measurement unit whether or not to change the excitation amount (applied voltage or excitation current) of at least one quadrupole field among the quadrupole fields of the first stage and the second stage, the calculation circuit which calculates the feedback amount with respect to the excitation amount of the quadrupole field when the determination of the determination unit is necessary, and the control unit which includes the table data for calculating the feedback amount and changes the excitation amount of the quadrupole field according to the differences between the deflection sensitivities in the calculation circuit which calculates the feedback amount.

(8) In the charged particle beam apparatus according to (7), the charged particle beam apparatus includes the detection circuit which detects the image shift amount caused by the deflector A and the measurement unit which measures the deflection sensitivity from the shift amount, and the excitation amount (applied voltage or excitation current) of at least one quadrupole field among the quadrupole fields of the first stage and the second stage is changed so that one or more of the difference between the deflection sensitivity in the x direction of the deflector B of the second stage obtained in the same method as described above and the deflection sensitivity in the y direction of the C deflector of the third stage and the difference between the deflection sensitivity in the y direction of the deflector B of the second stage and the deflection sensitivity in the x direction of the C deflector of the third stage in addition to the deflection sensitivities in the two perpendicular directions (for example, x' and y' directions) obtained by the measurement unit is smaller than a predetermined value.

(9) In the charged particle beam apparatus according to (7), the charged particle beam apparatus includes the detection circuit which detects the image shift amount caused by the deflector A and the measurement unit which measures the deflection sensitivity from the shift amount, and the excitation amount (applied voltage or excitation current) of at least one quadrupole field among the quadrupole fields of the first stage and the second stage is changed so that a difference between one or more of the deflection sensitivity in the x direction of the deflector B of the second stage obtained in the same method as described above, the deflection sensitivity in the y direction of the C deflector of the third stage, the deflection sensitivity in the y direction of the deflector b of the second stage, and the deflection sensitivity in the x direction of the C deflector of the third stage in addition to the deflection sensitivities in the two perpendicular directions (for example, x' and y' directions) obtained by the measurement unit and the predetermined value is smaller than the threshold value.

(10) In the charged particle beam apparatus according to any one of (4) to (9), the charged particle beam apparatus includes a deflector which deflects the charged particle beam and adjusts an incident position with respect to the aberration corrector, a quadrupole wobbling circuit which performs fine movement (wobbling) of intensities of quadrupoles independently of each stage of the multipoles, an axis deviation detection circuit which detects an image shift amount caused by the quadrupole wobbling, a deflection amount calculation circuit which calculates a deflection amount to be fed back to a deflector configured with multipoles and the deflector which adjusts the incident position with respect to the aberration corrector according to the image shift amount caused by the quadrupole wobbling of each stage, and a calculation circuit which calculates a deflection amount to be fed back to the deflector configured with a plurality of the multipoles based on the deflection amount, wherein deflection calculated according to the image shift amount in the amount calculation circuit is performed in cooperation with a plurality of stages of deflection.

(11) In the charged particle beam apparatus according to (3) or (10), the charged particle beam apparatus has a function of visually displaying a measurement result of the deflection sensitivity and the determination of performing the feedback.

(12) In the charged particle beam apparatus according to (3) or (10), the charged particle beam apparatus visually displays the feedback amount with respect to the quadrupole fields of each stage and visually display determination reflecting on the excitation amount of each quadrupole field.

(13) In the charged particle beam apparatus according to any one of (1), (2), (3), and (10), the charged particle beams connect the line cross in perpendicular directions at the respective multipole stages by the quadrupole fields.

(14) In the charged particle beam apparatus according to any one of (1), (2), (3), and (10), the charged particle beam apparatus calculates feedback with respect to the quadrupole fields simultaneously at a plurality of the stages and changes each of the deflection sensitivities by reflecting the feedback on the excitation amount of the quadrupole field of each stage.

(15) A charged particle beam apparatus including first and second multipoles (including electrodes, magnetic poles, and coils) which generate quadrupole fields, a first measurement unit which measures a deflection sensitivity of the second multipoles located to be closer to the sample than the first multipole, a first measurement unit which measures the deflection sensitivity of the second multipoles in different directions, or a second measurement unit which measures the deflection sensitivity of the third multipoles located to be closer to the sample than the second multipoles, wherein the second measurement unit measures the deflection sensitivity in different directions with respect to the deflection sensitivity measured by the first measurement unit, a determination unit which determines whether or not to change an excitation amount of the quadrupole fields of the first and second multipoles based on two different deflection sensitivities, and a control unit which changes the excitation amount when determination of the determination unit is necessary.

REFERENCE SIGNS LIST 101 first-stage multipole
102 second-stage multipole
103 third-stage multipole
104 fourth-stage multipole
105 alumina support
106 alumina support
109 cylindrical housing
111 screw
112 shaft
113 coil
114 outer magnetic path ring (magnetic yoke)
116 gap adjustment member
120 aberration corrector
121 fixture metal fittings
122 fixture metal fittings
125 permalloy shield
129 optical axis
130 control computer
131 field emission electron source
132 flushing power source
133 extraction power source
134 extraction electrode
135 second anode
136 acceleration power source
140 Schottky electron gun
141 Schottky electron source
142 suppressor electrode
144 first anode
146 power source for electron gun
147 power source for electron gun
201 charged particle source
202 charged particle beam
207a, 207b X trajectory
208a, 208b Y trajectory
209 line cross position/optical axis control device
210 SEM image shift amount extraction device
211 feedback determination device
212 feedback amount calculation device
301 SEM column
302 sample room
303 control unit
310 field emission electron gun
320 first condenser lens
321 movable diaphragm
322 second condenser lens
323 two-stage deflector
324 adjustment lens
325 reflecting plate
326 secondary electron detector
327 ExB deflector
328 object aligner
329 scanning deflector
330 astigmatic correction coil 331 objective lens
332 sample
333 sample stage
334 two-stage deflector
335 deflector power source
336 side entry sample holder
337 image calculation unit
338 image display device
340 first condenser lens power source
341 second condenser lens power source
342 deflector power source
343 aberration correction coil power source
3431 aberration correction voltage source
344 scan coil power source
345 objective lens power source
346 retarding power source
347 astigmatic correction coil power source
348 object aligner power source
349 ExB deflector power source
350 secondary electron detector power source
351 adjustment lens power source
352 vacuum container
353 projection lens
354 projection lens power source
355 annular detector
356 annular detector power source
357 on-axis detector
358 on-axis detector power source
360 transfer lens
361 spacer
376 data storage
377 monitor
378 operation console
401 sample preparation room
402 sample transport mechanism
403 gate valve
404 sample stage control mechanism

The invention claimed is:

1. A charged particle beam apparatus comprising:
a charged particle source;
a deflector which deflects a charged particle beam configured with charged particles emitted from the charged particle source;
an objective lens which concentrates the charged particle beam and irradiates a sample;
a detector which detects secondary electrons emitted from the sample by irradiation of the charged particle beam;
an image calculation unit which generates an image based on the secondary electrons detected by the detector;
an aberration corrector which is arranged at a subsequent stage of the deflector and corrects aberration of the charged particle beam;
a correction system which controls the aberration corrector; and
a control unit which controls the components,
wherein the aberration corrector includes two or more stages of multipoles which control the aberration of the charged particle beam,
wherein the multipoles of the first stage and the second stage constitute a first deflection unit and a second deflection unit which cause a deflection action in at least two directions of x and y directions, and
wherein the correction system includes:
a line cross position control device which controls a line cross position in the aberration corrector of the charged particle beam so that a designed value and an actually measured value of a line cross position are equal to each other;
an optical axis control device which controls an optical axis of the charged particle beam;
an image shift amount extraction device which extracts an image shift amount from an acquired image;
a feedback determination device which determines whether or not changing an excitation amount of at least one quadrupole field configured with the multipoles from the extracted image shift amount; and
a feedback amount calculation device which calculates a feedback amount with respect to the excitation amount of the quadrupole field based on table data for calculating the feedback amount in advance, in a case in which the feedback determination device determines that calculating said feedback amount is necessary, based on said extracted image shift amount.

2. The charged particle beam apparatus according to claim 1,
wherein the correction system controls the feedback amount so that at least two of the following items are smaller than predetermined threshold values,
(1) (deflection amount or deflection sensitivity of a polarization unit of the aberration corrector in the x direction)−(deflection amount or deflection sensitivity of the second deflection unit in the y direction),
(2) (deflection amount or deflection sensitivity of the polarization unit of the aberration corrector in the y direction)−(deflection amount or deflection sensitivity of the second deflection unit in the x direction),
(3) (deflection amount or deflection sensitivity of the deflector in the x direction)−(deflection amount or deflection sensitivity of the deflector in the y direction),
(4) (value of deflection amount or deflection sensitivity of the first deflection unit of the aberration corrector in the x direction)−(predetermined value (depending on optical conditions)),
(5) (value of deflection amount or deflection sensitivity of the second deflection unit of the aberration corrector in the y direction)−(predetermined value (depending on the optical conditions)),
(6) (value of deflection amount or deflection sensitivity of the first deflection unit of the aberration corrector in the y direction)−(predetermined value (depending on the optical conditions)),
(7) (value of deflection amount or deflection sensitivity of the second deflection unit of the aberration corrector in the x direction)−(predetermined value (depending on the optical conditions)),
(8) (value of deflection amount or deflection sensitivity of the deflector in the x direction)−(predetermined value (depending on optical conditions)), and
(9) (value of deflection amount or deflection sensitivity of the deflector in the y direction)−(predetermined value (depending on optical conditions)).

3. The charged particle beam apparatus according to claim 2,
wherein the deflector is capable of deflecting the charged particle beam and adjusting an incident position with respect to the aberration corrector,
wherein the line cross position control device includes a quadrupole wobbling circuit which performs wobbling movement of intensities of quadrupoles independently of each stage of the multipoles, wherein the image shift amount extraction device includes an axis deviation detection circuit which detects an image shift amount caused by quadrupole wobbling, wherein the feedback amount calculation device includes a deflection amount calculation circuit which calculates a first deflection amount to be fed back to the polarization unit and the second deflection unit which are configured with the multipoles of the first-stage and second-stage, and to the deflector which adjusts an incident position with respect to the aberration corrector according to the image shift amount caused by the quadrupole wobbling of each of said first- and second-stages, and another calculation circuit which calculates a second deflection amount to be fed back to the polarization unit and the second deflection unit which are configured with a plurality of the multipoles based on the first deflection amount, and wherein the first deflection amount calculated by the deflection amount calculation circuit according to the image shift amount is performed in cooperation with a plurality of stages of deflection.

4. The charged particle beam apparatus according to claim 1,
wherein the aberration corrector has four stages of multipoles, and
wherein the multipoles of the first stage and the second stage correspond to the second stage and the third stage of the aberration corrector.

5. The charged particle beam apparatus according to claim 2, wherein the correction system controls the feedback amount so that the items (1) and (2) are smaller than predetermined threshold values.

6. A correction system controlling an aberration corrector where two or more stages of multipoles which are arranged at a subsequent stage of a deflector deflecting a charged particle beam configured with charged particles emitted from a charged particle source and control aberration of the charged particle beam are provided and the multipoles of a first stage and a second stage constitute a first deflection unit and a second deflection unit which cause a deflection action in at least two directions of x and y directions, the correction system comprising:
a line cross position control device which controls a line cross position in the aberration corrector of the charged particle beam so that a designed value and an actually measured value of a line cross direction are equal to each other;
an optical axis control device which controls an optical axis of the charged particle beam;
an image shift amount extraction device which extracts an image shift amount from an acquired image;
a feedback determination device which determines whether or not changing an excitation amount of at least one quadrupole field configured with the multipoles from the extracted image shift amount; and
a feedback amount calculation device which calculates a feedback amount with respect to the excitation amount of the quadrupole field based on table data for calculating the feedback amount in advance, in a case in which the feedback determination device determines that calculating said feedback amount is necessary, based on said extracted image shift amount.

7. The correction system according to claim 6, wherein the correction system controls the feedback amount so that at least two of the following items are smaller than predetermined threshold values, (1) (deflection amount or deflection sensitivity of a polarization unit of the aberration corrector in the x direction)−(deflection amount or deflection sensitivity of the second deflection unit in the y direction),
(2) (deflection amount or deflection sensitivity of the polarization unit of the aberration corrector in the y direction)−(deflection amount or deflection sensitivity of the second deflection unit in the x direction),
(3) (deflection amount or deflection sensitivity of the deflector in the x direction)−(deflection amount or deflection sensitivity of the deflector in the y direction),
(4) (value of deflection amount or deflection sensitivity of the first deflection unit of the aberration corrector in the x direction)−(predetermined value (depending on optical conditions)),
(5) (value of deflection amount or deflection sensitivity of the second deflection unit of the aberration corrector in the y direction)−(predetermined value (depending on the optical conditions)),
(6) (value of deflection amount or deflection sensitivity of the first deflection unit of the aberration corrector in the y direction)−(predetermined value (depending on the optical conditions)),
(7) (value of deflection amount or deflection sensitivity of the second deflection unit of the aberration corrector in the x direction)−(predetermined value (depending on the optical conditions)),
(8) (value of deflection amount or deflection sensitivity of the deflector in the x direction)−(predetermined value (depending on optical conditions)), and
(9) (value of deflection amount or deflection sensitivity of the deflector in the y direction)−(predetermined value (depending on optical conditions)).

8. The correction system according to claim 7,
wherein the deflector is capable of deflecting the charged particle beam and adjusting an incident position with respect to the aberration corrector,
wherein the line cross position control device includes a quadrupole wobbling circuit which performs wobbling movement of intensities of quadrupoles independently of each stage of the multipoles,
wherein the image shift amount extraction device includes an axis deviation detection circuit which detects an image shift amount caused by quadrupole wobbling,
wherein the feedback amount calculation device includes a deflection amount calculation circuit which calculates a first deflection amount to be fed back to the polarization unit and the second deflection unit which are configured with the multipoles of the first-stage and second-stage, and to the deflector which adjusts an incident position with respect to the aberration corrector according to the image shift amount caused by the quadrupole wobbling of each of said first- and second-stages, and a calculation circuit which calculates a second deflection amount to be fed back to the polarization unit and the second deflection unit which are configured with a plurality of the multipoles based on the first deflection amount, and
wherein the first deflection amount calculated by the deflection amount calculation circuit according to the image shift amount is performed in cooperation with a plurality of stages of deflection.

9. The correction system according to claim 6,
wherein the aberration corrector has four stages of multipoles, and wherein the multipoles of the first stage and the second stage correspond to the second stage and the third stage of the aberration corrector.

10. The correction system according to claim 7, wherein the correction system controls the feedback amount so that the items (1) and (2) are smaller than predetermined threshold values.

11. An aberration correction method for controlling an aberration corrector where three or more stages of multipoles which are arranged at a subsequent stage of a deflector deflecting a charged particle beam configured with charged particles emitted from a charged particle source and control aberration of the charged particle beam are provided and the multipoles of a second stage and a third stage constitute a first deflection unit and a second deflection unit which cause a deflection action in at least two directions of x and y directions, the aberration correction method comprising:
 a first step of applying a voltage or excitation current to quadrupole fields of a first stage and the second stage to form line cross in the x direction and the y direction which have different directions in the vicinity of the poles of the second stage and the third stage;
 a second step of performing focusing and optical axis adjustment of the charged particle beam on a surface of a sample arranged at a subsequent stage of the aberration corrector;
 a third step of acquiring an SEM image under a condition that dipole fields of the second stage, the third stage, and the deflector in the x direction and/or the y direction are all off and single on;
 a fourth step of calculating at least two of the following items by using the SEM image,
 (1) (deflection amount or deflection sensitivity of a polarization unit of the aberration corrector in the x direction)−(deflection amount or deflection sensitivity of the second deflection unit in the y direction),
 (2) (deflection amount or deflection sensitivity of the polarization unit of the aberration corrector in the y direction)−(deflection amount or deflection sensitivity of the second deflection unit in the x direction),
 (3) (deflection amount or deflection sensitivity of the deflector in the x direction)−(deflection amount or deflection sensitivity of the deflector in the y direction),
 (4) (value of deflection amount or deflection sensitivity of the first deflection unit of the aberration corrector in the x direction)−(predetermined value (depending on optical conditions)),
 (5) (value of deflection amount or deflection sensitivity of the second deflection unit of the aberration corrector in the y direction)−(predetermined value (depending on the optical conditions)),
 (6) (value of deflection amount or deflection sensitivity of the first deflection unit of the aberration corrector in the y direction)−(predetermined value (depending on the optical conditions)),
 (7) (value of deflection amount or deflection sensitivity of the second deflection unit of the aberration corrector in the x direction)−(predetermined value (depending on the optical conditions)),
 (8) (value of deflection amount or deflection sensitivity of the deflector in the x direction)−(predetermined value (depending on optical conditions)), and
 (9) (value of deflection amount or deflection sensitivity of the deflector in the y direction)−(predetermined value (depending on optical conditions));
 a fifth step of comparing the values of at least two items obtained in the fourth step with respective predetermined threshold values; and
 a sixth step of performing feedback to the applied voltage or the excitation current of the quadrupole fields of the first stage and the second stage in a case where values of the at least two items are larger than the respective predetermined threshold values in the fifth step and terminating the feedback in other cases.

12. The aberration correction method according to claim 11,
 wherein the third step is a step of acquiring the SEM image under the condition that the dipole field in the x direction and the y direction of the second stage and the third stage are all off and single on, and
 wherein the fourth step is a step of calculating the values of (1) and (2) from the SEM image.

13. The aberration correction method according to claim 11,
 wherein the third step is a step of acquiring the SEM image under the condition that the dipole fields in the x direction of the second stage and the y direction of the third stage and the dipole fields in the x direction of the deflector are all off and single on, and
 wherein the fourth step is a step of calculating the values of (1) and (8).

14. The aberration correction method according to claim 11,
 wherein the third step is a step of acquiring the SEM image under the condition that the dipole fields in the x direction of the second stage and the y direction of the third stage and the dipole fields in the x direction of the deflector are all off and single on, and
 wherein the fourth step is a step of calculating the values of the (2) and (8).

15. The charged particle beam apparatus according to claim 1, wherein the designed value and the actually measured value of the line cross position of the charged particle beam in the aberration corrector are equal to each other and a range in which a focus deviation amount of the charged particle beam with respect to the aberration corrector is within ±5% so as to maintain no anisotropy in an incident aperture angle and the optical magnification of the charged particle beam.

* * * * *